US 9,267,959 B2

(12) United States Patent
Hochreutiner et al.

(10) Patent No.: US 9,267,959 B2
(45) Date of Patent: Feb. 23, 2016

(54) MEASUREMENT OF BLADED ROTORS

(75) Inventors: Olivier Hochreutiner, Lausanne (CH);
Jonathan Geisheimer, Neyruz (CH);
Thomas Holst, Villars-sur-Glâne (CH);
Sylvain Queloz, Belfaux (CH); David Kwapisz, Villars-sur-Glâne (CH);
Rachid Naid-Abdellah,
Villars-sur-Glâne (CH)

(73) Assignee: Meggitt SA, Fribourg (CH)

( * ) Notice: Subject to any disclaimer, the term of this patent is extended or adjusted under 35 U.S.C. 154(b) by 1008 days.

(21) Appl. No.: 13/427,015

(22) Filed: Mar. 22, 2012

(65) Prior Publication Data
US 2012/0242351 A1 Sep. 27, 2012

Related U.S. Application Data

(60) Provisional application No. 61/466,622, filed on Mar. 23, 2011.

(51) Int. Cl.
*G01S 13/58* (2006.01)
*G01S 13/88* (2006.01)
(Continued)

(52) U.S. Cl.
CPC ... *G01P 3/00* (2013.01); *G01P 3/48* (2013.01); *G01S 13/58* (2013.01); *G01S 13/88* (2013.01); *G01R 27/04* (2013.01); *G01S 2007/2886* (2013.01)

(58) Field of Classification Search
CPC ............... G01P 3/00; G01P 3/42; G01P 3/44; G01P 3/46; G01P 3/48; G01P 3/4802; G01P 3/4805; G01P 3/481; G01P 3/489; G01R 27/00; G01R 27/02; G01R 27/04; G01S 7/02; G01S 7/28; G01S 7/285; G01S 7/288; G01S 2007/2886; G01S 7/35; G01S 7/352; G01S 2007/358; G01S 13/02; G01S 13/50; G01S 13/58; G01S 13/581; G01S 13/583; G01S 13/88; G01B 15/00; G01H 1/003; G01H 1/006
USPC ............ 342/27, 28, 104–115, 175, 192–197, 342/350, 385, 417, 418; 60/39.01, 39.091, 60/39.34, 772, 779; 324/600, 629, 637, 324/642, 644, 71.1; 702/1, 57, 66, 75, 76, 702/77, 127, 142, 145, 155, 158, 159; 73/570, 584, 596, 618, 620, 649, 655, 73/658, 660
See application file for complete search history.

(56) References Cited

U.S. PATENT DOCUMENTS 3,471,856 A    10/1969   Laughlin, Jr. et al.
3,747,105 A *   7/1973   Payne ........................... 342/418
(Continued)

OTHER PUBLICATIONS

European Search Report for corresponding European Patent Application EP 12760703.4, issued Jul. 22, 2014.
(Continued)

*Primary Examiner* — Bernarr Gregory
(74) *Attorney, Agent, or Firm* — King & Spalding

(57) ABSTRACT

Measurement of bladed rotors and, more particularly, speed measurement of bladed rotors in a turbine engine using microwave probes is described. In one embodiment, an apparatus for measuring bladed includes a microwave sensor that radiates a microwave signal toward a bladed rotor and receives a reflected microwave signal from the bladed rotor, a radio frequency module that generates the microwave signal radiated by the microwave sensor and down-converts the reflected microwave signal into a down-converted signal, and a main processing module configured to generate an output pulse train signal representative of a speed of the bladed rotor based on the down-converted signal. In another embodiment, a method for measuring bladed rotors is described including radiating a microwave signal, receiving a reflected microwave signal, down-converting the reflected microwave signal, and generating an output pulse train signal representative of a speed of a bladed rotor based on the down-converted signal.

36 Claims, 13 Drawing Sheets

(51) Int. Cl.
*G01P 3/00* (2006.01)
*G01P 3/48* (2006.01)
*G01S 13/00* (2006.01)
*G01R 27/04* (2006.01)
*G01S 7/288* (2006.01)

(56) References Cited

U.S. PATENT DOCUMENTS

| | | | |
|---|---|---|---|
| 3,763,491 A | 10/1973 | Ishman | |
| 4,131,889 A | 12/1978 | Gray | |
| 4,275,396 A * | 6/1981 | Jacomini | 342/192 |
| 4,346,383 A * | 8/1982 | Woolcock et al. | 324/644 |
| 4,413,519 A * | 11/1983 | Bannister et al. | 73/660 |
| 4,507,658 A * | 3/1985 | Keating | 73/660 |
| 4,573,358 A | 3/1986 | Luongo | |
| 5,206,816 A * | 4/1993 | Hill et al. | 73/660 |
| 5,479,449 A | 12/1995 | Patel et al. | |
| 5,479,826 A * | 1/1996 | Twerdochlib et al. | 73/660 |
| 5,689,268 A * | 11/1997 | Shi et al. | 342/196 |
| 6,573,861 B1 * | 6/2003 | Hommel et al. | 342/192 |
| 6,833,793 B2 * | 12/2004 | Dzieciol et al. | 60/39.34 |
| 7,095,221 B2 * | 8/2006 | Bosselmann et al. | 324/71.1 |
| 7,373,823 B2 * | 5/2008 | Bosselmann et al. | 73/620 |
| 7,483,800 B2 * | 1/2009 | Geisheimer et al. | 702/77 |
| 7,756,487 B2 | 7/2010 | Lerner et al. | |
| 7,825,669 B2 * | 11/2010 | Parsons et al. | 324/644 |
| 7,889,119 B2 * | 2/2011 | Evers et al. | 342/104 |
| 7,890,293 B2 * | 2/2011 | Bosselmann | G01B 15/00 702/159 |
| 7,969,165 B2 * | 6/2011 | Bosselmann | G01B 15/00 324/644 |
| 8,096,184 B2 * | 1/2012 | Twerdochlib | 73/655 |
| 8,205,503 B2 * | 6/2012 | Cox | 73/660 |
| 8,504,321 B2 * | 8/2013 | Seidel et al. | 702/145 |
| 9,000,777 B2 * | 4/2015 | Holmquist | G01H 1/006 324/644 |
| 9,008,997 B2 * | 4/2015 | Srinivasa et al. | 702/145 |
| 2007/0245708 A1 * | 10/2007 | Southwick | 60/39.091 |
| 2007/0245746 A1 * | 10/2007 | Mollmann et al. | 60/779 |
| 2008/0195338 A1 | 8/2008 | Geisheimer | |
| 2010/0007565 A1 | 1/2010 | Amiri et al. | |
| 2010/0332180 A1 | 12/2010 | Seidel et al. | |

OTHER PUBLICATIONS

International Preliminary Report on Patentability for corresponding international application, PCT/US2012/030076, issued Oct. 3, 2013.
International Search Report from PCT/US12/030076, Jul. 13, 2012.
Office Action for corresponding Chinese Patent Application No. 201280024699.4, issued Oct. 10, 2014.

* cited by examiner

MEASUREMENT OF BLADED ROTORS

CROSS-REFERENCE TO RELATED APPLICATION

This application claims the benefit of U.S. Provisional Application No. 61/466,622, filed Mar. 23, 2011, the entire contents of which are hereby incorporated herein by reference.

TECHNICAL FIELD

The present invention generally relates to the measurement of the speed of blade rotors in a turbine engine and, more particularly, to the measurement of the speed of bladed rotors in a turbine engine using microwave probes and various embodiments of analog and digital circuitry.

BACKGROUND

Sensing systems are employed for a wide variety of purposes. Sensing systems may detect motion of an object or environmental conditions, for example. Sensing applications are applicable to many industries such as medical, processing, transportation, and aeronautics industries, among others. Because of the diversity in purpose for sensing systems, many considerations must be considered by engineers when designing a new sensing system. Considerations such as cost, precision, measurement range, durability, maintenance, and even physical characteristics are generally considered by engineers.

Non-contact sensing systems are sensing systems that, unlike contact sensing systems, do not require a sensor to physically contact an object being measured. Non-contact sensing systems offer many advantages over contact sensing systems, such as the ability to provide information regarding an object and/or condition of interest without expensive and invasive sensor mounting assemblies. Non-contact systems, unlike contact systems, are also advantageous because they do not impact the system they measure. Radar systems include one example of a non-invasive sensing system. Radar systems use transmitted and reflected radio waves, typically on the order of 0.9-100 GHz, to determine the presence, location, and/or speed of objects. Some radar systems operate by transmitting either a constant continuous wave (CW) signal or a pulsed signal. Most CW radar systems operate under the principle of the Doppler effect, in which the change in reflected signal phase and/or frequency with respect to a transmitted signal phase and frequency is measured. CW radar systems that rely on the Doppler effect provide a mechanism of detecting a moving object by transmitting microwaves at a targeted object and detecting the change in frequency and/or phase of microwave signals reflected from the object.

Further, non-contact radar techniques provide a sensing mechanism that is relatively unaffected by temperature, dust, debris, water, and many other obscurants when the proper transmit frequencies are used. Radar sensing systems may accurately provide information on the speed, location, and direction of movement of targets being sensed, as compared to other less-accurate sensing systems. One need in aeronautics or power generation applications, for example, would be to determine accurately the speed of a turbine engine and, particularly, the speed of one or more bladed rotors in a turbine engine.

In this context, the present invention is directed to addressing deficiencies of conventional measurement systems with systems and methods for accurately sensing the speed of a moving object such as a bladed rotor of a turbine engine.

SUMMARY

In one embodiment, an apparatus for measuring bladed rotors is described, including a microwave sensor that radiates a microwave signal toward a bladed rotor and receives a reflected microwave signal from the bladed rotor, a radio frequency module that generates the microwave signal radiated by the microwave sensor and down-converts the reflected microwave signal into a down-converted signal, and a main processing module configured to generate an output pulse train signal representative of a speed of the bladed rotor based on the down-converted signal.

In certain aspects, the main processing module comprises a bank of sub-band filters, a signal energy detector, a bank of sub-band energy detectors, a sub-band selector, and an in-phase/quadrature output selector. Further, the signal energy detector may comprise an in-phase energy detector that detects a mean energy of an in-phase portion of the down-converted signal, a quadrature energy detector that detects a mean energy of a quadrature portion of the down-converted signal, and a summer that sums the mean energy of the in-phase portion of the down-converted signal and the mean energy of the quadrature portion of the down-converted signal as a total mean energy of the down-converted signal.

In other aspects, the bank of sub-band filters comprises a plurality of sub-band filter pairs, each sub-band filter pair comprises an in-phase sub-band filter and a quadrature sub-band filter, each in-phase sub-band filter comprises a band-pass filter that provides an in-phase band-passed signal based on the in-phase portion of the down converted signal, a mean energy detector that detects a mean energy of the in-phase band-passed signal, and a zero-crossing detector that detects zero-crossings of the in-phase band-passed signal and generates an in-phase pulse train signal based on the zero-crossings of the in-phase band-passed signal, and each quadrature sub-band filter comprises a band-pass filter that provides a quadrature band-passed signal based on the quadrature portion of the down converted signal, a mean energy detector that detects a mean energy of the quadrature band-passed signal, and a zero-crossing detector that detects zero-crossings of the quadrature band-passed signal and generates a quadrature pulse train signal based on the zero-crossings of the quadrature band-passed signal.

In other aspects, the bank of sub-band energy detectors comprises a plurality of sub-band energy detectors, and each sub-band energy detector comprises a summer that sums the mean energy of the in-phase band-passed signal and the mean energy of the quadrature band-passed signal from a respective in-phase and quadrature sub-band filter pair as a total mean sub-band energy, and a comparator that compares the total mean sub-band energy to the total mean energy of the down-converted signal and provides a sub-band selection signal. Further, in certain embodiments, the sub-band selector comprises selection logic, an in-phase sub-band selector, and a quadrature sub-band selector, the selection logic generates control signals for the in-phase sub-band selector and the quadrature sub-band selector based on the sub-band selection signals from the sub-band energy detectors, the in-phase sub-band selector selects an in-phase pulse train signal among the in-phase pulse train signals generated from the in-phase sub-band filters for output as a selected in-phase pulse train signal based on the control signals, and the quadrature-phase sub-band selector selects a quadrature pulse train signal among the quadrature pulse train signals generated from the quadrature sub-band filters for output as a selected quadrature pulse train signal based on the control signals.

In still other aspects, the in-phase/quadrature output selector may output one of the selected in-phase pulse train signal and the selected quadrature pulse train signal as the output pulse train signal representative of the speed of the bladed rotor. In other embodiments, the in-phase/quadrature output selector is configured to select one of the selected in-phase pulse train signal and the selected quadrature pulse train signal for output as the output pulse train signal representative of the speed of the bladed rotor, and maintain the selection of the one of the pulse train signals for output until a predetermined number of falling or rising edges occurs on an other one of the pulse train signals while no falling or rising edges occur on the selected one of the pulse train signals.

In another embodiment, a method for measuring bladed rotors is described, including radiating a microwave signal toward a bladed rotor, receiving a reflected microwave signal from the bladed rotor, down-converting the reflected microwave signal into a down-converted signal, and generating an output pulse train signal representative of a speed of the bladed rotor based on the down-converted signal. In certain aspects, generating the output pulse train signal further includes detecting a mean energy of an in-phase portion of the down-converted signal and a mean energy of a quadrature portion of the down-converted signal, summing the mean energy of the in-phase portion of the down-converted signal and the mean energy of the quadrature portion of the down-converted signal as a total mean energy of the down-converted signal.

In other aspects, generating the output pulse train signal further comprises, for each of a plurality of sub-bands of the down-converted signal, band-pass filtering the in-phase portion of the down-converted signal to provide an in-phase band-passed signal, detecting a mean energy of the in-phase band-passed signal, detecting zero-crossings of the in-phase band-passed signal, generating an in-phase pulse train signal based on the zero-crossings of the in-phase band-passed signal, band-pass filtering the quadrature portion of the down-converted signal to provide a quadrature band-passed signal, detecting a mean energy of the quadrature band-passed signal, detecting zero-crossings of the quadrature band-passed signal, and generating a quadrature pulse train signal based on the zero-crossings of the quadrature band-passed signal.

In still other aspects, generating the output pulse train signal further includes, for each of the plurality of sub-bands of the down-converted signal, summing the mean energies of the in-phase and quadrature band-passed signals as a total mean sub-band energy, and comparing the total mean sub-band energy to the total mean energy of the down-converted signal to provide a sub-band selection signal. Further, in other aspects, generating the output pulse train signal further includes generating control signals based on the sub-band selection signals, selecting an in-phase pulse train signal among the in-phase pulse train signals of the plurality of sub-bands for output as a selected in-phase pulse train signal based on the control signals, and selecting a quadrature pulse train signal among the quadrature pulse train signals of the plurality of sub-bands for output as a selected quadrature pulse train signal based on the control signals. Additionally, in other aspects, generating the output pulse train signal further includes selecting one of the selected in-phase pulse train signal and the selected quadrature pulse train signal as the output pulse train signal representative of the speed of the bladed rotor.

In another embodiment, an apparatus for measuring bladed rotors is described, including a microwave sensor that radiates a microwave signal toward a bladed rotor and receives a reflected microwave signal from the bladed rotor, a radio frequency module that generates the microwave signal radiated by the microwave sensor and down-converts the reflected microwave signal into a down-converted signal, and a main processing module comprising a band-pass filter, a tracking filter, a digital pulse generator, and an in-phase/quadrature output selector, the main processing module being configured to generate an output pulse train signal representative of a speed of the bladed rotor based on the down-converted signal. In certain aspects, the band-pass filter passes frequencies of the down-converted signal corresponding to a fundamental frequency of the down-converted signal and rejects other frequencies to generate a band-passed signal. Further, in certain aspects, the tracking filter further includes a tunable low-pass filter and mean energy detector that low-pass filters the band-passed signal based on a control signal and generates a first mean energy output based on an output of the low-pass filter, a second mean energy detector that determines a second mean energy output based on the band-passed signal, and a controller that generates the control signal based on a difference between the first and second mean energy outputs.

In other aspects, the digital pulse generator comprises a second tunable filter that filters the band-passed signal based on the control signal, and a pulse generator that detects zero-crossings of the signal output by the second tunable filter and generates a pulse train signal based on the zero-crossings. Further, in other aspects, the digital pulse generator comprises in-phase and quadrature pulse generators, the in-phase pulse generator further comprises an in-phase tunable filter that filters an in-phase portion of the band-passed signal based on the control signal, and the quadrature pulse generator further comprises a quadrature tunable filter that filters a quadrature portion of the band-passed signal based on the control signal.

In still other aspects, the in-phase pulse generator further comprises an in-phase pulse generator that detects zero-crossings of the signal output by the in-phase tunable filter and generates an in-phase pulse train signal based on the in-phase zero-crossings, and the quadrature pulse generator further comprises a quadrature pulse generator that detects zero-crossings of the signal output by the quadrature tunable filter and generates a quadrature pulse train signal based on the quadrature zero-crossings. Further, in other aspects, the in-phase/quadrature output selector outputs one of the in-phase pulse train signal and the quadrature pulse train signal as the output pulse train signal representative of the speed of the bladed rotor.

In another embodiment, a method for measuring bladed rotors is described, including radiating a microwave signal toward a bladed rotor, receiving a reflected microwave signal from the bladed rotor, down-converting the reflected microwave signal into a down-converted signal, and generating an output pulse train signal representative of a speed of the bladed rotor based on the down-converted signal, wherein generating the output pulse train signal further comprises passing frequencies of the down-converted signal corresponding to a fundamental frequency of the down-converted signal and rejecting other frequencies to generate a band-passed signal, and filtering the band-passed signal in response to a control signal to provide a filtered output.

In one aspect, the method further includes producing a first mean energy output based on the filtered output, and producing a second mean energy based on the band-passed signal. In other aspects, the method further includes generating the control signal based on a difference between the first and second mean energy outputs. Further, in other aspects, the method further includes second filtering the band-passed signal in response to the control signal to provide a second filtered output, detecting zero-crossings of the second filtered output, and generating the output pulse train signal based on the zero-crossings.

In another embodiment, an apparatus for measuring bladed rotors is described, including a sensor that radiates a signal toward a bladed rotor and receives a reflected signal from the bladed rotor, a radio frequency module that generates the signal radiated by the sensor and down-converts the reflected signal into a down-converted signal, and a main processing module configured to generate an output pulse train signal representative of a speed of the bladed rotor based on the down-converted signal. In one aspect, the main processing module includes a bank of sub-band filters, a signal energy detector, a bank of sub-band energy detectors, and a sub-band selector, and the signal energy detector detects a mean energy of the down-converted signal. In other aspects, the bank of sub-band filters comprises a plurality of sub-band filters, and each sub-band filter comprises a band-pass filter that provides a band-passed signal based on the down converted signal, a mean energy detector that detects a mean energy of the band-passed signal, and a zero-crossing detector that detects zero-crossings of the band-passed signal and generates a pulse train signal based on the zero-crossings of the band-passed signal.

In certain aspects, the bank of sub-band energy detectors includes a plurality of sub-band energy detectors, and each sub-band energy detector comprises a comparator that compares the mean energy of a respective one of the band-passed signals to the mean energy of the down-converted signal and provides a sub-band selection signal. Further, in one embodiment, the sub-band selector comprises selection logic and a sub-band selector, the selection logic generates control signals for the sub-band selector based on the sub-band selection signals from the sub-band energy detectors, and the sub-band selector selects a pulse train signal among the pulse train signals generated from the sub-band filters for output as the output pulse train signal based on the control signals.

In still another embodiment, an apparatus for measuring bladed rotors is describe, including a sensor that radiates a signal toward a bladed rotor and receives a reflected microwave signal from the bladed rotor, a radio frequency module that generates the signal radiated by the sensor and down-converts the reflected signal into a down-converted signal, and a main processing module comprising a band-pass filter, a tracking filter, and a digital pulse generator, the main processing module being configured to generate an output pulse train signal representative of a speed of the bladed rotor based on the down-converted signal. In one aspect, the band-pass filter passes frequencies of the down-converted signal corresponding to a fundamental frequency of the down-converted signal and rejects other frequencies to generate a band-passed signal.

In other aspects, the tracking filter further comprises a tunable low-pass filter and mean energy detector that low-pass filters the band-passed signal based on a control signal and generates a first mean energy output based on an output of the low-pass filter, a second mean energy detector that determines a second mean energy output based on the band-passed signal, and a controller that generates the control signal based on a difference between the first and second mean energy outputs. Further, in one embodiment, the digital pulse generator comprises a second tunable filter that filters the band-passed signal based on the control signal, and a pulse generator that detects zero-crossings of the signal output by the second tunable filter and generates the output pulse train signal based on the zero-crossings.

These and other aspects, objects, features, and embodiments will become apparent to a person of ordinary skill in the art upon consideration of the following detailed description of illustrative embodiments exemplifying the best mode for carrying out the invention as presently perceived.

BRIEF DESCRIPTION OF THE DRAWINGS

For a more complete understanding of the invention and the advantages thereof, reference is now made to the following description, in conjunction with the accompanying figures briefly described as follows.

Figure 1:
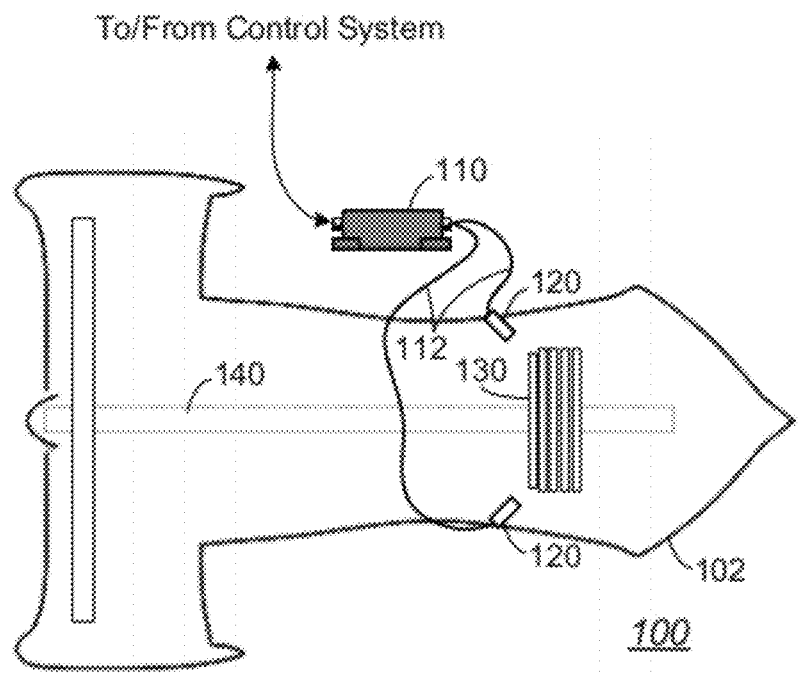
FIG. 1 illustrates a speed measurement system according to one embodiment.

The drawings illustrate only exemplary embodiments of the invention and are therefore not to be considered limiting of its scope, as the invention may admit to other equally effective embodiments. The elements and features shown in the drawings are not necessarily to scale, emphasis instead being placed upon clearly illustrating the principles of the exemplary embodiments. Additionally, certain dimensions or positionings may be exaggerated to help visually convey such principles.

DETAILED DESCRIPTION

In the following paragraphs, the present invention will be described in further detail by way of example with reference to the attached drawings. In the description, well known components, methods, and/or processing techniques are omitted or briefly described so as not to obscure the invention. As used herein, the "present invention" refers to any one of the embodiments of the invention described herein and any equivalents. Furthermore, reference to various feature(s) of the "present invention" is not to suggest that all embodiments must include the referenced feature(s).

At the outset, technology features that differentiate microwave technology from other technologies for bladed rotor measurement are described. It is noted that microwave sensing is relatively insensitive to contaminants such as those within an engine. Microwave signals generally pass directly through contaminants from engine environments. Even when microwave probe tips are completely coated with carbon using an acetylene torch without oxygen, the probe tips have been shown to operate suitably for microwave measurements. In such cases, heavy carbon coatings on probe tips absorb a small portion of microwaves, but measurements are generally left unaffected. Long-term operation has confirmed such results in several instances.

The microwave systems described herein are able to operate with high signal-to-noise ratios even at extended ranges. Further, microwave systems permit measurements to be taken at relatively large distances between microwave probes and objects being measured. Overall signal-to-noise ratios are affected as distance to target objects increase, but, for speed measurement, distances up to 100 mm or more may be suitable. The microwave systems described herein also have a naturally large bandwidth and are designed with a flat frequency response over a range of speeds to be measured. This allows for reliable measurements throughout an entire operating range of an engine being measured.

In some aspects, microwave probes and microwave transmission cables are more prone to failure, because these components may be placed in high temperature and vibration regions of an engine being measured. An exemplary location of a microwave probe for measurement of a bladed rotor of a turbine engine is in front of the stage to be measured, looking aft at an angle relative to the shaft center-line of the bladed rotor. In this way, individual blades of the bladed rotor pass in front of the sensor. Another option is to aim the microwave probe directly down at the blade tips. This configuration provides an interrupted blade signal to generate the speed information. In general, any position in which the microwave probe faces an "interrupted" pattern of the object being measured and free space, such as facing gear teeth, fan blades, and mixing blades, for example, is a candidate for speed measurement.

The microwave probes used in the embodiments described herein are designed for high-temperature applications. The survivability of a microwave probe depends, in part, upon the mechanical design, material, and joining technology used to manufacture the probe. The high-temperature front-end of the microwave probes includes a ceramic window, which serves to protect the internal microwave elements but is transparent to the microwaves. The ceramic and metal elements of the probes are joined together using high temperature braze procedures above 1300° C. For many embodiments described herein, the probes do not require bleed cooling air. The mechanical parts and materials selected for the probes are chosen to reduce thermal expansion. Behind the ceramic window, the microwave antenna structure of the microwave probe is relatively simple and robust in terms of survival.

One aspect of the survivability of the microwave probes is maintaining a hermetic seal with the cable that supplies the microwave signal for transmission, so that no contamination of occurs. Normally, the primary failure mode of microwave probes is the loss of hermeticity in this joint due to harsh temperature cycling and thermal expansion mismatch between the probe and the joint of the cable. In certain embodiments, to mitigate this risk, primary seal and backup seals may be relied upon. The first line of protection for the probe is the primary seal at the ceramic window. This joint is designed to survive $1^{st}$ stage turbine temperatures. However, if this seal were to break, the probe is expected to have minimal degradation as the internal parts of the probe may be plated with platinum, for example, to keep them from oxidizing. The second seal will be an additional hermetic feed at the cable. As long as the ceramic window maintains mechanical integrity and the cable feed is hermetic, the probe will continue to operate. Any failure of the probe due to cable contamination is likely to manifest itself as a slow loss in signal over time.

Turning now to the drawings, in which like numerals indicate like, but not necessarily the same, elements throughout, exemplary embodiments of the invention are described in detail.

Figure 2:
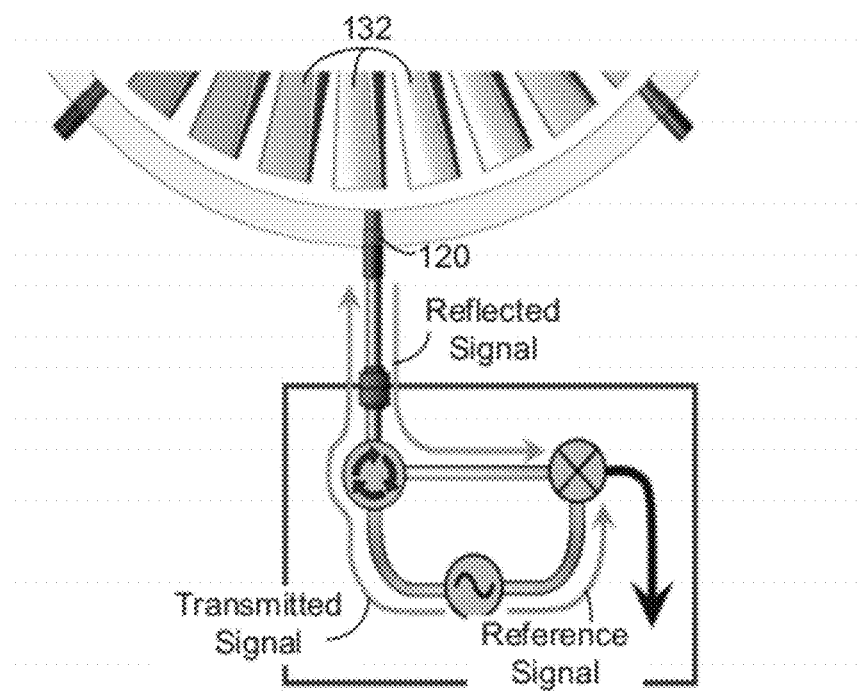
FIG. 2 provides an illustration of a principle for speed measurement according to certain aspects of the present invention.

FIG. 1 illustrates a speed measurement system 100 according to one embodiment of the present invention. The system 100 includes an engine 102, an electronics unit 110, and at least one microwave probe 120 coupled to the electronics unit 110 via coupling 112. Among embodiments, the engine 102 may comprise any gas turbine, rotary, or similar engine, without limitation. Among other elements as understood in the art, the engine 102 comprises at least one bladed rotor 130 connected to a shaft 140. The engine 102 operates based on the compression of intake air by a rotary compressor or turbine for a combustion cycle that generates thrust. As illustrated in FIG. 2, the bladed rotor 130 comprises a plurality of blades 132 which cause the rotor 130 to turn about an axis of symmetry when combustion exhaust is forced over them, turning the shaft 140. As described herein, the bladed rotor 130 is a rotor within a hot section of the engine 102. However, it is noted that the engine 102 may comprise a plurality of bladed rotors and that any bladed rotor(s) or other "interrupted" pattern of the engine 102 may be measured using the system 100. While FIG. 1 illustrates two microwave sensors 120, embodiments incorporating one or more than two sensors are within the scope of the disclosure. Further, it is noted that, in alternative embodiments, proximity sensors other than microwave probes may be used. In that case, the electronics unit 110 may be modified as compared to when microwave probes are used, as described in further detail below.

The microwave probes 120 are adapted to radiate a microwave signal and receive a reflected microwave signal. In FIG.

1, the microwave probes 120 are adapted to radiate a microwave signal toward the bladed rotor 130 and receive a reflected microwave signal from the bladed rotor 130. Based on the radiation of microwave signals and the receipt of reflected microwave signals, the microwave probes 120 are used to measure the rotation of the bladed rotor 130 at relatively long distances and in the harsh environment of the hot combustion section of the engine 102. In the context of speed measurement of the engine 102 when the engine is attached to an aircraft to provide trust, the electronics unit 110 and microwave probes 120 are configured to measure the speed of the rotor 130 and, more particularly, the rate at which the blades 132 rotate about the shaft 140. In an embodiment where the system 100 is implemented in an aircraft, the electronics unit 110 may be configured to interface directly with an engine controller of the aircraft to provide a digital signal, such as a digital pulse train, indicating the rate of rotation or speed of the rotor 130 and the blades 132.

With reference again to FIG. 2, an illustration of a principle for speed measurement according to certain aspects of the present invention is described. Generally, a continuous microwave signal is generated, transmitted, and radiated toward the blades 132. The microwave signal is reflected off the blades 132 as a reflected microwave signal, and the reflected microwave signal is captured and returned for processing. In certain embodiments, the processing includes comparing the reflected microwave signal with a reference signal representative of the originally generated and transmitted microwave signal, to identify amplitude and phase modulations of the reflected microwave signal caused by the rotated reflection of the blades 132.

The microwave signal may be a microwave signal having a frequency of 6 or 24 GHz, for example. In terms of the system 100, the electronics unit 110 generates the continuous microwave signal and transmits the microwave signal to the microwave probes 120 via the couplings 112 for radiation of the microwave signal. The couplings 112 may comprise any suitable transmission line for microwave signals and, preferably, be hermetically joined to the microwave sensors 120. The microwave probes 120 radiate the microwave signal towards the blades 132 and receive a reflected microwave signal from the blades 132 which is returned via the couplings 112 to the electronics unit 110 for processing. The electronics unit 110 compares the reflected microwave signal with the reference signal and analyzes the amplitude and phase modulations of the reflected microwave signal to generate an output signal representative of a speed of the bladed rotor 130. Among embodiments described herein, the electronics unit 110 comprises analog, digital, or combinations of analog and digital circuitry to generate the output signal as described in further detail below.

Figure 3A:
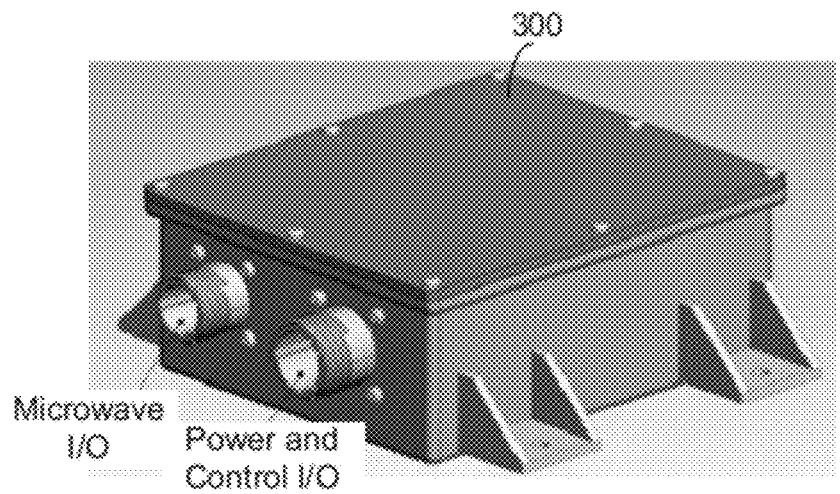
FIG. 3A illustrates an example embodiment of a housing for an electronics unit of a speed measurement system.
Figure 3B:
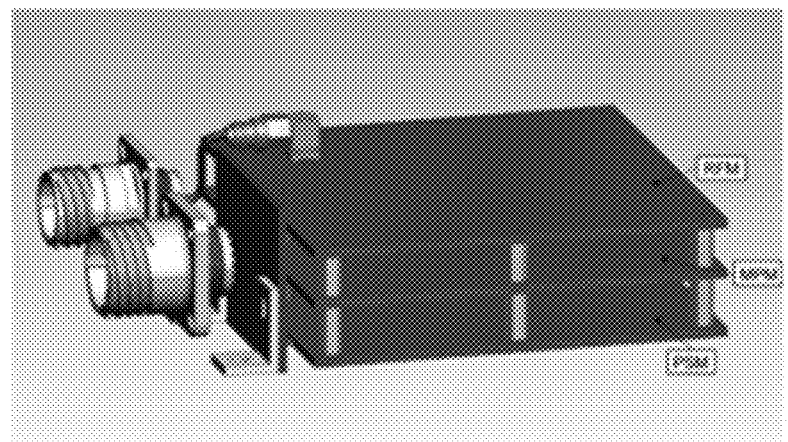
FIG. 3B illustrates an example embodiment of an arrangement of electronic circuit boards within the housing illustrated in FIG. 3A.

FIG. 3A illustrates an example embodiment of a housing 300 for an electronics unit of a speed measurement system and FIG. 3B illustrates an example embodiment of an arrangement of electronic circuit boards within the housing 300 illustrated in FIG. 3A. The housing 300 illustrated in FIG. 3A is an example embodiment of a housing for the electronics unit 110. As illustrated, the housing 300 includes a microwave I/O port and a power and control Input/Output (I/O) port. The microwave I/O port may be coupled to the couplings 112 for transmission and return of microwave signals to and from the microwave probes 120. Among other couplings, the control I/O port may be coupled to a power source for the electronics unit 110 and to the engine controller of an aircraft, as described above. The housing 300 may be formed from any material suitable for the application such as aluminum or other metals or plastic, for example, and the housing 300 may comprise several sections fastened together with screws, rivets, or other fasteners, as suitable and necessary for the application. One or more electronic circuit boards of the electronics unit 100 may be stacked and enclosed within the housing 300. For example, the circuit boards may include a Radio Frequency Module (RFM), a Main Processing Module (MPM), and a Power Supply Module (PSM), among others, as described in further detail below.

Figure 4:
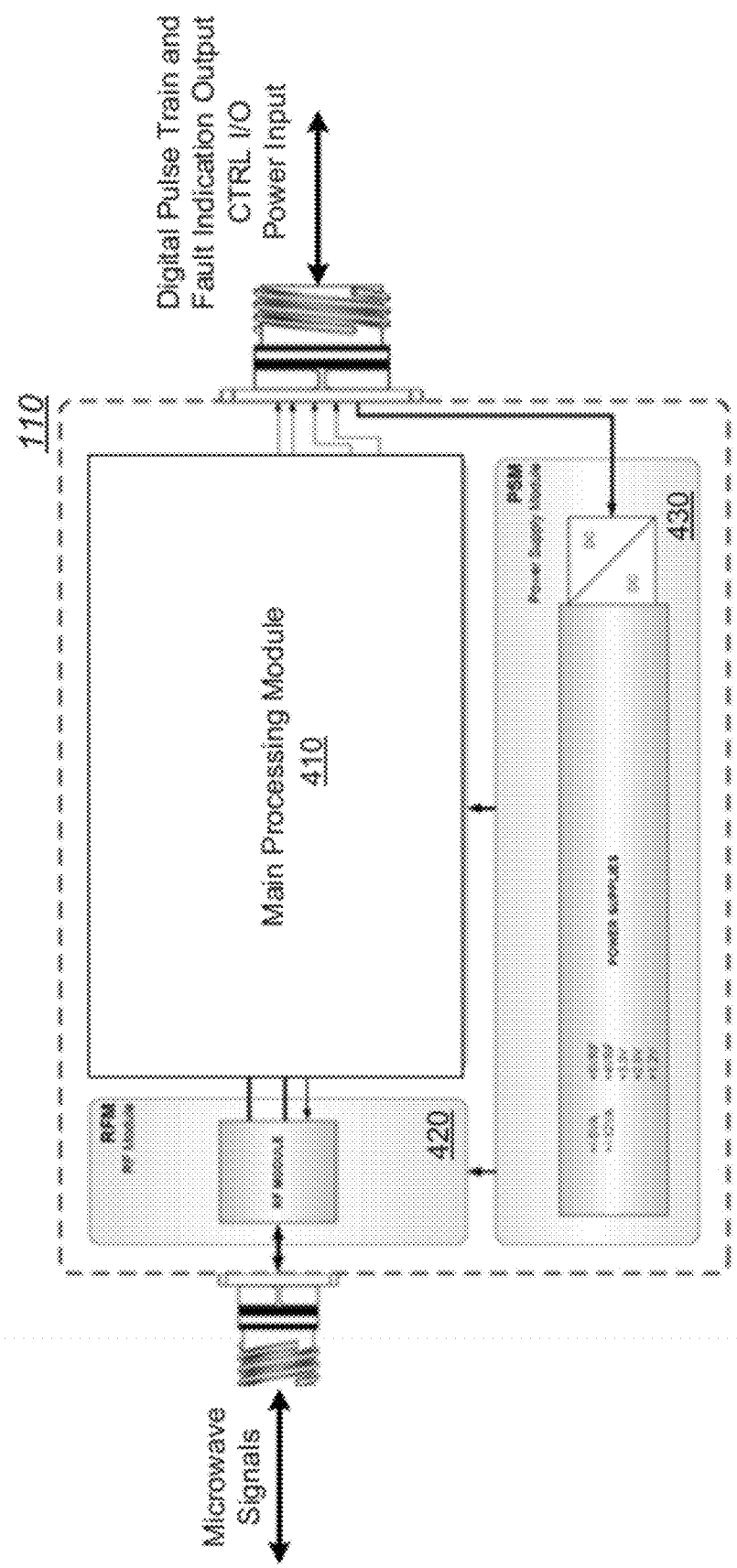
FIG. 4 illustrates a high-level block diagram of an example embodiment of an electronics unit for a speed measurement system.

Turning to FIG. 4, a high-level block diagram of an example embodiment of the electronics unit 110 is described in further detail. As illustrated, the electronics unit 110 includes an RFM 420, an MPM 410, and a PSM 430. As described in further detail below, the RFM 420 generates a microwave signal for radiation by at least one microwave probe, such as the microwave probes 120, based on the control of the MPM 410. In turn, the microwave probes 120 radiate the microwave signal toward the bladed rotor 130 and capture reflected microwave signals reflected from the bladed rotor 130, as noted above. The RFM 420 receives the reflected microwave signal from the microwave probes 120, down-converts the reflected microwave signal into a down-converted signal, and passes the down-converted signal to the MPM 410 for additional processing. The MPM 410 is configured to generate an output pulse train signal representative of a speed of the bladed rotor 130 based on the down-converted signal. In one embodiment, the PSM 430 comprises a Direct-Current to Direct-Current (DC/DC) converter, as would be understood in the art. As such, the PSM 430 is configured to receive power at a first voltage and generate power for the electronics unit 110 at one or more second voltages based on the received power. As one non-limiting example, the PSM 430 is configured to receive a 12 VDC input and generate output voltages at 5 VDC, 4 VDC, 3.3 VDC, 2.5 VDC, and 1.2 VDC, as necessary for the various circuitry of the electronics unit 110, although other input and output voltages of the PSM 430 are within the scope of the disclosure.

Figure 5:
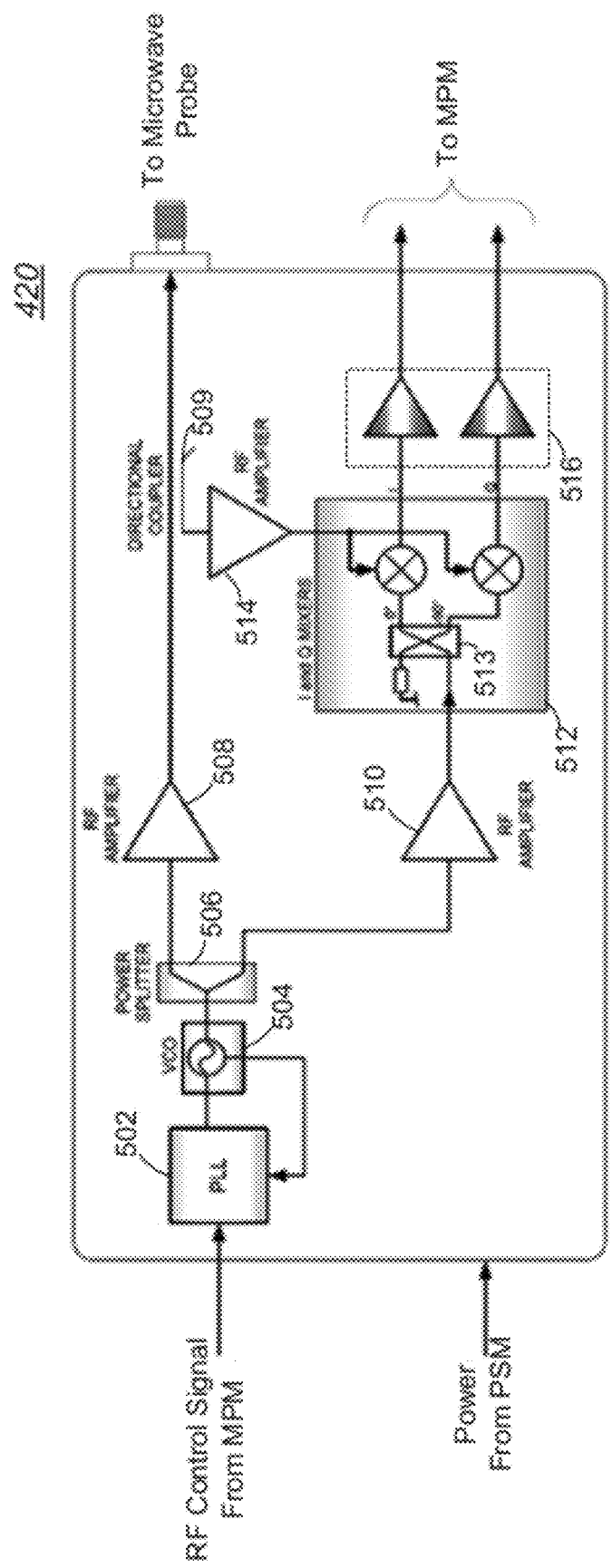
FIG. 5 illustrates an example embodiment of a Radio-Frequency Module according to certain aspects of the present invention.

Turning to FIG. 5, an example embodiment of the RFM 420 is described in further detail. According to the illustrated example, the RFM 420 comprises a Phase Locked Loop (PLL) 502, a Voltage Controlled Oscillator (VCO) 504, a power splitter 506, Radio Frequency (RF) amplifiers 508, 510, and 514, a directional coupler 509, In-phase and Quadrature (I/Q) mixers 512, and amplifiers 516. As illustrated, the RFM 420 receives power from the PSM 430 and an RF control signal from the MPM 410. Based on the RF control signal from the MPM 410, the PLL 502 and VCO 504 generate a microwave signal at a desired frequency for microwave radiation (i.e., 6 or 24 GHz). In certain embodiments, the RF control signal from the MPM 410 is a microwave signal at the desired microwave frequency and the PLL 502 and VCO 504 frequency and phase lock to the RF control signal from the MPM 410. In other embodiments, the RF control signal comprises a signal having a frequency that is a ratio of the desired microwave frequency, and the PLL and VCO 504 lock to and multiply the frequency of the RF control signal from the MPM 410 to generate the microwave signal at the desired frequency for microwave radiation. In still other embodiments, the RF control signal comprises a control voltage, and the PLL 502 and VCO 504 generate the microwave signal at the desired frequency for radiation based on the control voltage.

The power splitter 506 splits the microwave signal generated by the PLL 502 and VCO 504. One output of the power splitter 506 is provided to the RF amplifier 508 and the RF amplifier 508 amplifies the microwave signal for radiation by the microwave probes 120. Another output of the power splitter 506 is provided to the RF amplifier 510 and the RF amplifier 510 amplifies and provides the microwave signal to the I/Q mixers 512 for mixing with the reflected microwave signal returned by the microwave probes 120 to provide a down-converted signal including I/Q portions. Specifically, over the same path (i.e., couplings 121) that the microwave signal is provided by the RF amplifier 508 for radiation by the microwave probes 120, a reflected microwave signal is returned by the microwave probes 120. The reflected microwave signal is coupled to the I/Q mixers 512 by the directional coupler 509 and the I/Q mixers 512 mix the reflected microwave signal with the output of the RF amplifier 510 to provide a down-converted signal including I/Q portions. It is noted that the I/Q mixers includes a phase shifter 513 that provides I and Q portions of the reference output of the RF amplifier 510 for down-conversion.

Thus, with reference back to the illustration of FIG. 2, the output of the RF amplifier 508 corresponds to the transmitted microwave signal, the output of the RF amplifier 510 corresponds to the reference microwave signal, and the output of the RF amplifier 509 corresponds to the reflected microwave signal. In one embodiment, the down-converted signal output by the I/Q mixers 512 is amplified by the amplifiers 516 before being provided to the MPM 410. In other embodiments, the amplifiers 516 may be omitted or integrated as part of the MPM 410. Additionally, it is noted that the amount of amplification provided respectively by the RF amplifiers 508, 510, and 514 may be selected based on required signal levels.

Figure 6A:
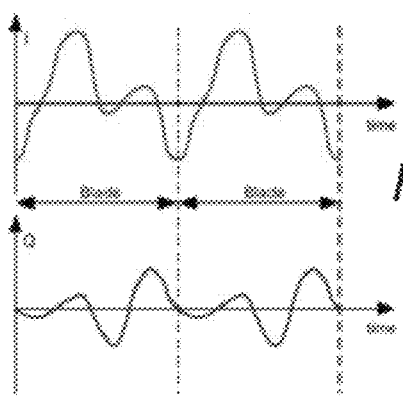
FIG. 6A illustrates an example of In-phase and Quadrature signal portions of a reflected microwave signal.
Figure 6B:
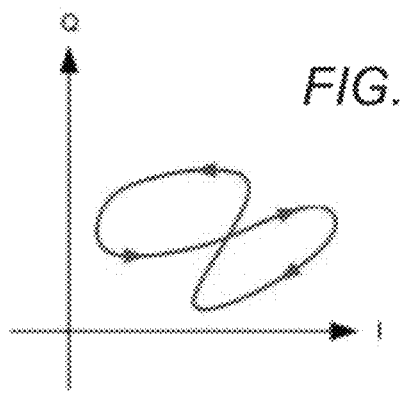
FIG. 6B illustrates an example of a reflected microwave signal in the In-phase/Quadrature plane.
Figure 7A:
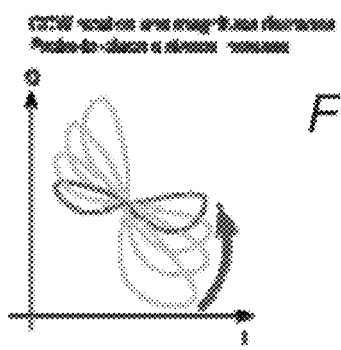
FIGS. 7A and 7B illustrate examples of waveform variations based on probe-to-blade distance variations.
Figure 7B:
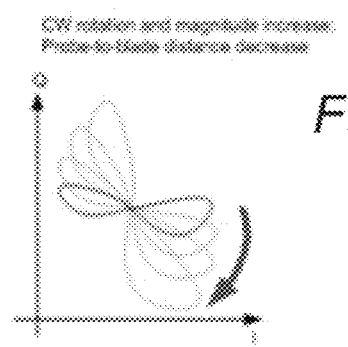
Figure 7C:
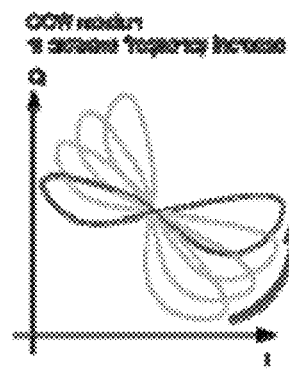
FIGS. 7C and 7D illustrate examples of waveform variations based on transmission frequency variations.
Figure 7D:
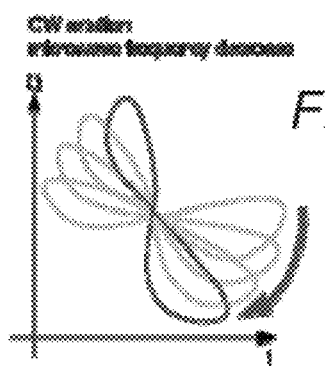

With reference to FIG. 6A, an example of I/Q signal portions of a down-converted signal output by the I/Q mixers 512 is described. Particularly, in FIG. 6A, example I/Q signal portions are illustrated over time for two periods of blade microwave reflection. As described in additional detail below, the I/Q signal portions are processed by the MPM 410 to generate an output pulse train signal representative of a speed of a bladed rotor, such as the speed of the bladed rotor 130. It is noted that, in certain embodiments, the MPM 410 may select one of the I or the Q portions of the down-converted signal over time to generate the output pulse train. The selection of the one of the I or the Q portions of the down-converted signal may depend upon, for example, rotation of the I/Q signal portions in the I/Q signal plane, which may depend upon various factors such as probe-to-blade distance and changes in the frequency of the radiated microwave signal over time, for example. These factors may depend in part upon environmental conditions such as temperature and humidity changes over time. With reference to FIG. 6B, an example of the I/Q signal portions in the I/Q signal plane is illustrated. In the I/Q signal plane, the down-converted signal may appear to oscillate along a continuous path at a rate determined according to the speed of the bladed rotor 130. The MPM 410 is configured to determine the rate at which the down-converted signal traverses from opposing ends of the continuous path illustrated in FIG. 6B, for example, as a measure of the speed of the bladed rotor 130.

As noted above, the shape and position of the waveform illustrated in FIG. 6B may vary over time based on various factors such as probe-to-blade distance and frequency change of the radiated microwave signal over time. Examples of the impact of these factors on the I/Q signal portions in the I/Q signal plane are illustrated in FIGS. 7A-7D. As compared to the waveform illustrated in FIG. 6B, the waveform illustrated in FIG. 7A has experienced a counter-clockwise rotation and decreased magnitude in response to an increased probe-to-blade distance. In contrast, as compared to the waveform illustrated in FIG. 6B, the waveform illustrated in FIG. 7B has experienced a clockwise rotation and increased magnitude in response to a decreased probe-to-blade distance. The waveform illustrated in FIG. 7C has experienced a counter-clockwise rotation in response to an increased frequency of the radiated microwave signal over time. In contrast, the waveform illustrated in FIG. 7D has experienced a clockwise rotation in response to a decreased frequency of the radiated microwave signal over time. As described in further detail below, the MPM 410 is designed and configured to generate an output pulse train signal representative of the speed of the bladed rotor 130 based on the down-converted signal output by the I/Q mixers 512, even when the I/Q signal portions of the down-converted signal vary over time as illustrated in FIGS. 7A-7D.

Figure 8:
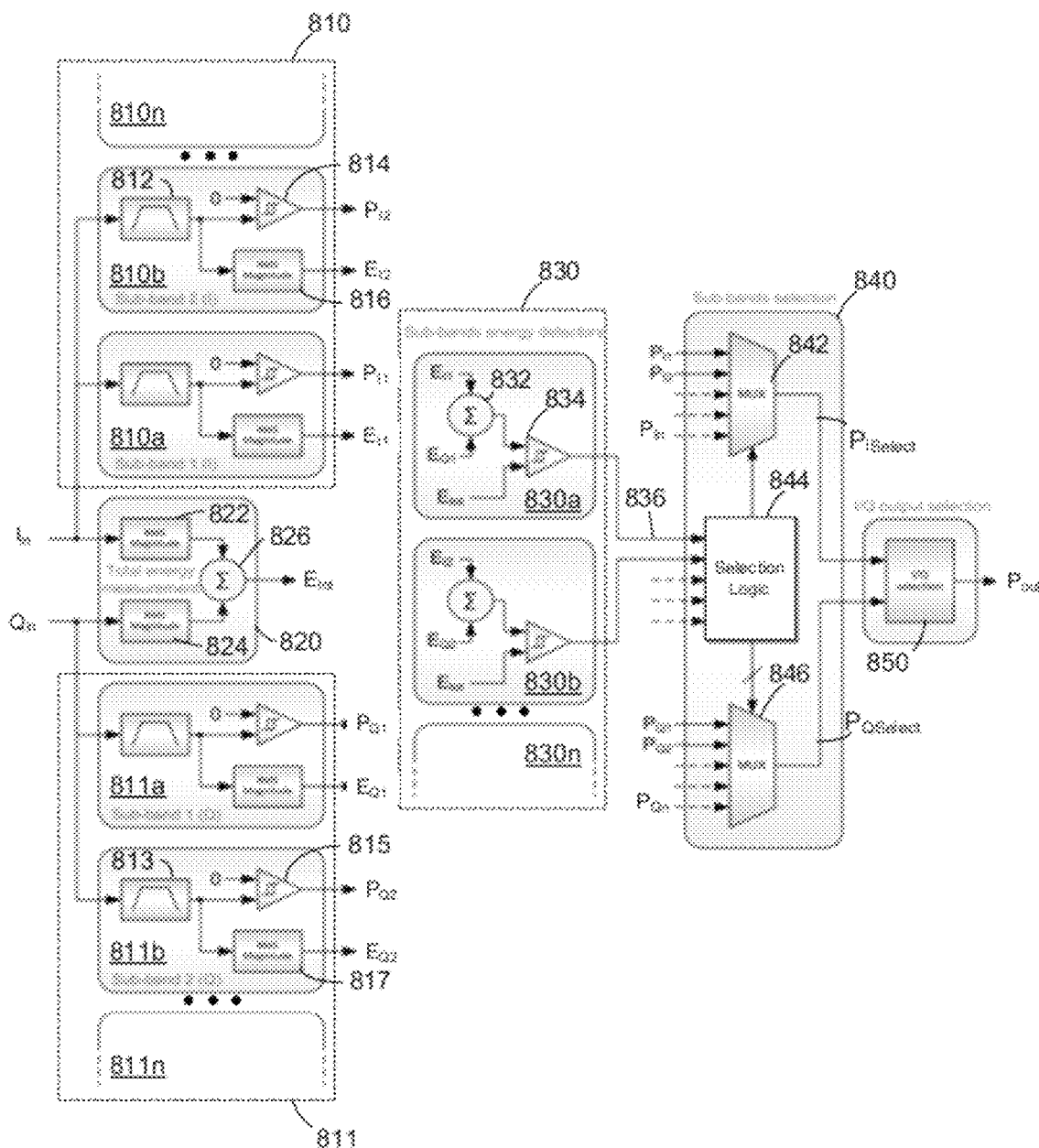
FIG. 8 illustrates an example schematic diagram of one embodiment of a main processing module according to certain aspects of the present invention.

Turning to FIG. 8, an example schematic diagram of one exemplary embodiment of the MPM 410 is described in detail. The embodiment of the MPM 410 illustrated in FIG. 8 may be implemented by analog, digital, or a combination of analog and digital circuitry, as understood by one having ordinary skill in the art. As described herein, however, the MPM 410 illustrated in FIG. 8 is implemented by analog circuitry. That is, the embodiment of the MPM 410 illustrated in FIG. 8 is implemented without any signal conversion using an analog-to-digital (A/D) converter. As illustrated, the MPM 410 includes a bank of sub-band filters 810 and 811, a signal energy detector 820, a bank of sub-band energy detectors 830, a sub-band selector 840, and an I/Q output selector 850. The signal energy detector 820 includes an in-phase energy detector 822 that detects a mean energy of the I portion of the down-converted signal ($I_{in}$), a quadrature energy detector 824 that detects a mean energy of the Q portion of the down-converted signal ($Q_{in}$), and a summer 826 that sums the mean energies of the I and Q portions of the down-converted signal to provide a total mean energy signal, $E_{tot}$, of the down-converted signal. The energy detectors 822 and 824 may detect the mean energy of the I and Q portions, respectively, of the down-converted signal based on a Root Mean Squared (RMS) function, as understood in the art. Other mean energy detection methodologies or functions of the detectors 822 and 824 (i.e., other than RMS) are within the scope of the disclosure.

Figure 9:
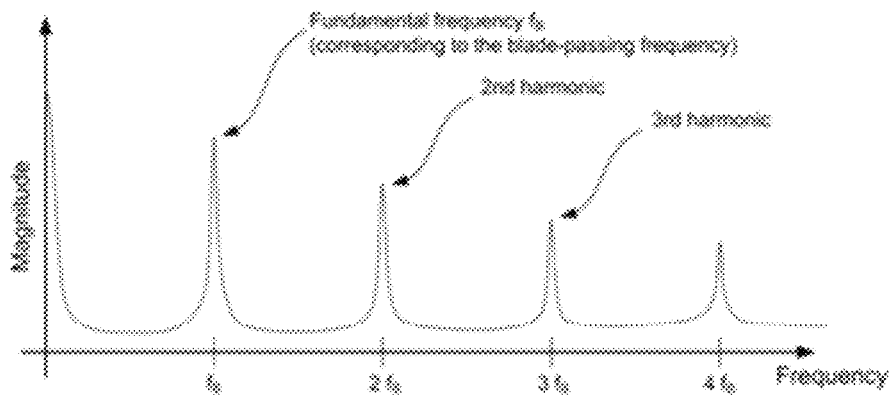
FIG. 9 provides an illustration of a fundamental frequency principle according to certain aspects of the present invention.
Figure 10:
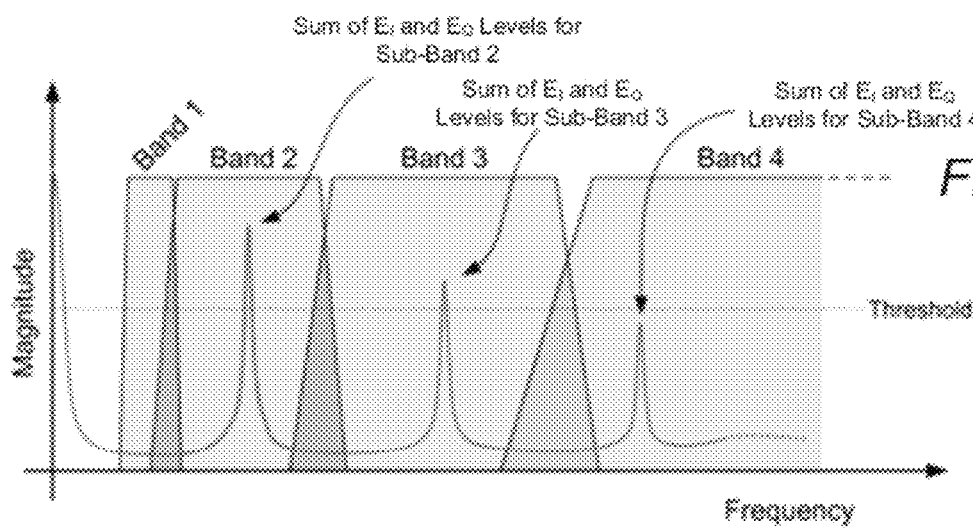
FIG. 10 provides an illustration of a sub-band bandwidth principle according to certain aspects of the present invention.

The bank of sub-band filters 810 and 811 includes a plurality of sub-band filter pairs, where each sub-band filter pair comprises an in-phase sub-band filter 810 and a corresponding respective quadrature sub-band filter 811. Each pair of sub-band filters, 810a and 811a, 810b and 811b, ... and 810n and 811n operates on a respective sub-band of the down-converted signal. Particularly, the bank of sub-band filters 810 and 811 divide the down-converted signal into sub-bands corresponding to the fundamental frequency of the down-converted signal and the harmonics of the fundamental frequency. The width of each sub-band in frequency is smaller than one octave. That is, the stop frequency of each sub-band is less than two times the start frequency of each sub-band (i.e., $f_{stop} < 2 \cdot f_{start}$, where $f_{start}$ is a bottom boundary of the sub-band and $f_{stop}$ is a top boundary of the sub-band). An example of the fundamental frequency and harmonics of the down-converted signal and the respective bandwidths of each of the sub-bands is illustrated in FIGS. 9 and 10. In FIG. 9, an example of the fundamental frequency of the down-converted signal, which corresponds to the blade-passing frequency, is illustrated along with the harmonics of the fundamental frequency. In FIG. 10, an example of the respective bandwidths of each of the plurality of sub-band filter pairs is illustrated.

As can be seen in FIG. 10, each sub-band has adjacent sub-bands above and below in frequency, except for the lowest and highest sub-bands, and the union of all sub-bands covers a full speed range of interest of the bladed rotor 130.

The minimum number of bands required to cover the full speed range of interest of the bladed rotor 130, from $f_{min}$ to $f_{max}$, is given by:

$$n_{bands} = \left\lceil \frac{\log(f_{max}) - \log(f_{min})}{\log 2} \right\rceil,$$

where $\lceil \cdot \rceil$ denotes the ceiling function.

With reference back to FIG. 8, each in-phase sub-band filter 810a-n comprises a band-pass filter 812 that provides a band-passed signal based on the in-phase portion of $I_{in}$, the down converted signal, a mean energy detector 816 that detects a mean energy of the in-phase band-passed signal $E_I$, and a zero-crossing detector 814 that detects zero-crossings of the in-phase band-passed signal and generates an in-phase pulse train signal $P_I$ based on the zero-crossings of the in-phase band-passed signal. Similarly, each quadrature sub-band filter 811a-n comprises a band-pass filter 813 that provides a quadrature band-passed signal based on the quadrature portion $Q_{in}$ of the down converted signal, a mean energy detector 817 that detects a mean energy of the quadrature band-passed signal $E_Q$, and a zero-crossing detector 815 that detects zero-crossings of the quadrature band-passed signal and generates a quadrature pulse train signal $P_Q$ based on the zero-crossings of the quadrature band-passed signal. The energy detectors 816 and 817 may detect the mean energy based on an RMS function, although other methodologies or functions are within the scope of the disclosure.

As further illustrated in FIG. 8, the bank of sub-band energy detectors 830 includes a sub-band energy detector 830a, 830b, ... 830n corresponding to each sub-band filter pair 810a and 811a, 810b and 811b, ... and 810n and 811n. Each sub-band energy detector 830 comprises a summer 832 that sums the mean energy of an in-phase band-passed signal $E_I$ and the mean energy of a quadrature band-passed signal $E_Q$ from a respective sub-band filter pair as a total mean sub-band energy. Each sub-band energy detector 830 further comprises a comparator 834 that compares the total mean sub-band energy output by the summer 832 to the total mean energy $E_{tot}$ of the down-converted signal and provides a sub-band selection signal 836.

The sub-band selector 840 comprises selection logic 844, an in-phase sub-band selector 842, and a quadrature sub-band selector 846. The selection logic 844 generates control signals for the in-phase sub-band selector 842 and the quadrature sub-band selector 846 based on the sub-band selection signals 836 from the sub-band energy detectors. In turn, the in-phase sub-band selector 842 selects an in-phase pulse train signal among the in-phase pulse train signals $P_I$ generated from the in-phase sub-band filters 810a-810n for output as a selected in-phase pulse train signal $P_{ISelect}$ based on the control signals, and the quadrature-phase sub-band selector 846 selects a quadrature pulse train signal among the quadrature pulse train signals $P_Q$ generated from the quadrature sub-band filters 811a-811n for output as a selected quadrature pulse train signal $N_{QSelect}$ based on the control signals.

The selection logic 844 generates the control signals to select the pulse train signals $P_I$ and $P_Q$ corresponding to a sub-band containing the fundamental frequency. The selection criterion applied by the selection logic 844 includes selecting a lowest sub-band in the frequency spectrum whose RMS level (sum of $E_I$ and $E_Q$ RMS levels) is higher than a threshold set to a fixed percentage of the total mean energy signal $E_{tot}$. FIG. 10 illustrates an example of a selection threshold according to the selection criterion applied by the selection logic 844. Based on the example illustrated in FIG. 10, the selection logic 844 would generate control signals to select the $P_I$ and $P_Q$ pulse train signals that correspond to the "Band 2" sub-band via the sub-band selectors 842 and 846. That is, the selection logic 844 generates control signals to select the $P_I$ and $P_Q$ pulse train signals derived from the "Band 2" sub-band because the "Band 2" sub-band is the lowest sub-band in frequency whose sum of $E_I$ and $E_Q$ levels is higher than the threshold, which is a fixed percentage of the total mean energy signal $E_{tot}$.

Figure 11:
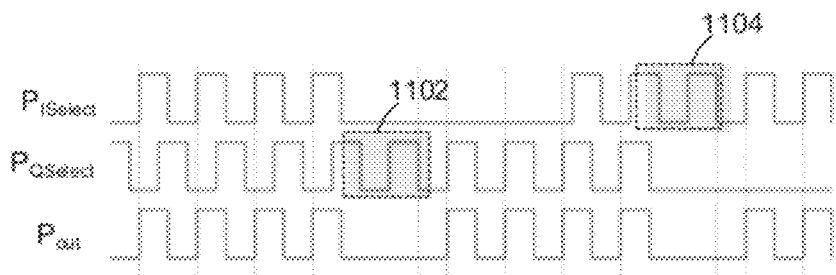
FIG. 11 provides an illustration of a signal selection principle according to certain aspects of the present invention.

With reference again to FIG. 8, the I/Q output selector 850 outputs one of the selected in-phase pulse train signal $P_{ISelect}$ and the selected quadrature pulse train signal $N_{QSelect}$ as the output pulse train signal $P_{out}$ representative of the speed of the bladed rotor 130. The selection criterion applied by the I/Q output selector 850 includes maintaining a current selection of either the selected pulse train signals $P_{ISelect}$ and $P_{QSelect}$ until a predetermined number of edges (falling or rising) occur on the other signal while no edge occurs on the selected signal. In one embodiment, the predetermined number of falling or rising edges may be 3 edges, but other numbers of edges such as 2 or 4, for example, are within the scope of this disclosure. This selection criterion is further illustrated in FIG. 11. In FIG. 11, the signal $P_{ISelect}$ is output until three edges 1102 occur on the signal $P_{QSelect}$ while no edge occurs on the signal $P_{ISelect}$. In turn, the signal $P_{QSelect}$ is output until three edges 1104 occur on the signal P while no edge occurs on the signal $P_{QSelect}$. In this context, it is noted that, when the I/Q signal portions of the down-converted signal rotate as discussed above and illustrated in FIGS. 7A-D, only one of the zero-crossing detectors 814 and 815 may detect zero crossings of the I/Q signal portions. The I/Q output selector 850 is adapted to account for the fact that the I/Q signal portions of the down-converted signal may rotate over time and, thus, the detection of zero crossings of the I/Q signal portions may transition from an in-phase zero crossing detector 814 to a quadrature zero-crossing detector 815 or vice versa.

In general, the output pulse train signal $P_{out}$ representative of the speed of the bladed rotor 130 is provided to the engine controller of an aircraft, so that the engine controller has feedback regarding the speed of the rotor 130. Referencing the output pulse train signal $P_{out}$, the engine controller is able to close a control loop between the engine controller and the engine 102 based on the speed of the rotor 130. As such, the engine controller is able to calculate various metrics of the performance of the engine 102 including performance metrics that indicate engine damage, failure, or dangerous operating conditions. The engine controller is thus better able to shut down the engine 102 if it is determined that the engine is operating in a dangerous operating condition based on the output pulse train signal $P_{out}$.

It is noted that, in alternative embodiments, proximity sensors other than microwave probes may be used. If a proximity sensor other than a microwave probe is used, in certain embodiments, a reflected signal received by the proximity sensor may be down-converted without using separate in-phase and quadrature channels. In this case, the configuration of FIG. 8 may be modified to rely on only one of the in-phase and quadrature sections. In other words, without separate in-phase and quadrature down-converted channels, the configuration of FIG. 8 may be modified for only a single channel similar to either one of the in-phase or quadrature sections.

Figure 12:
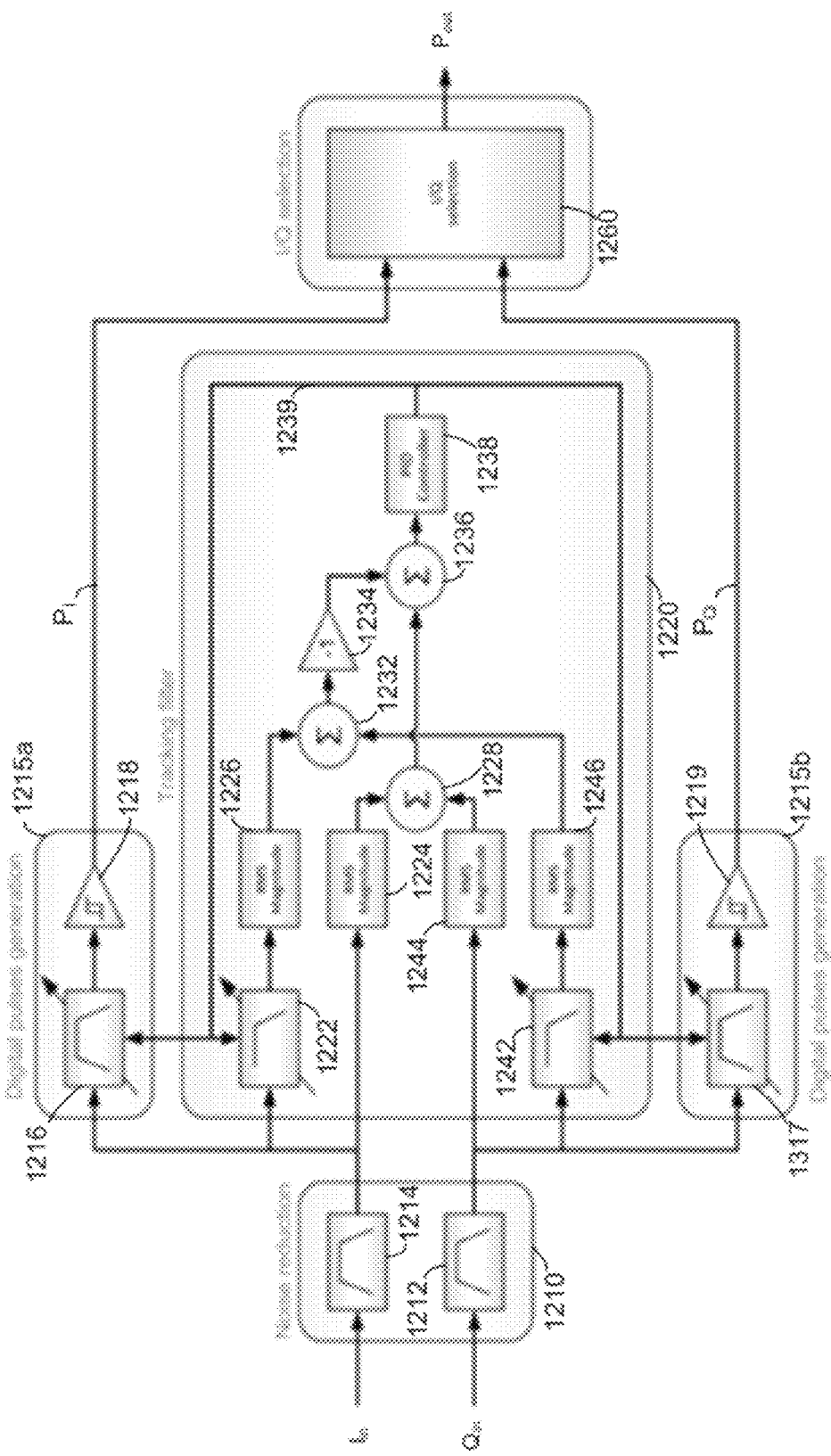
FIG. 12 illustrates an example schematic diagram of another embodiment of a main processing module according to certain aspects of the present invention.

Turning to FIG. 12, an example schematic diagram of another embodiment of the MPM 410 is described in detail. It is again noted that, although the embodiment of the MPM 410 illustrated in FIG. 12 may be implemented by analog, digital, or a combination of analog and digital circuitry, the exemplary embodiment of the MPM 410 illustrated in FIG. 12 is implemented by analog circuitry. In FIG. 12, the MPM 410 includes a band-pass filter 1210, a tracking filter 1220, a digital pulse generator 1215 (1215a and 1215b), and an I/Q output selector 1260. The band-pass filter 1210 includes in-phase band-pass filter 1214 and quadrature band-pass filter 1212. In one embodiment, the band-pass filters 1212 and 1214 pass frequencies over a range corresponding to the fundamental frequency of the down-converted signal and certain harmonics of the fundamental frequency and reject other frequencies, to reduce noise. In this context, the band-pass filters 1212 and 1214 produce a band-passed down-converted output signal.

The tracking filter 1220 includes a pair of in-phase and quadrature tunable low-pass filters 1222 and 1242, respectively, that are tuned by a proportional-integral-derivative (PID) controller 1238. The in-phase tunable low-pass filter 1222 receives the output of the in-phase band pass filter 1214, and the quadrature tunable low-pass filter 1242 receives the output of the quadrature band pass filter 1212. The PID controller 1238 is configured to generate a control signal 1239 to adjust or tune the cut-off frequency of the low-pass filters 1222 and 1242 such that the combined energy of the output signal of each is a certain percentage of the combined energy of the input signal of each. The certain percentage is defined in various embodiments according to a relative energy of the fundamental frequency of the reflected microwave blade-passing signal in relation to the energy of the down-converted signal. In other words, when the output energy of the filters 1222 and 1242 is below a target energy, the PID controller 1238 increases the cut-off frequency of the filters 1222 and 1242 via the control signal 1239. Conversely, when the output energy of the filters 1222 and 1242 is above the target energy, the PID controller decreases the cut-off frequency of the filters 1222 and 1242. In this manner, the tracking filter 1220 tracks the fundamental frequency of the reflected microwave blade-passing signal.

Figure 13:
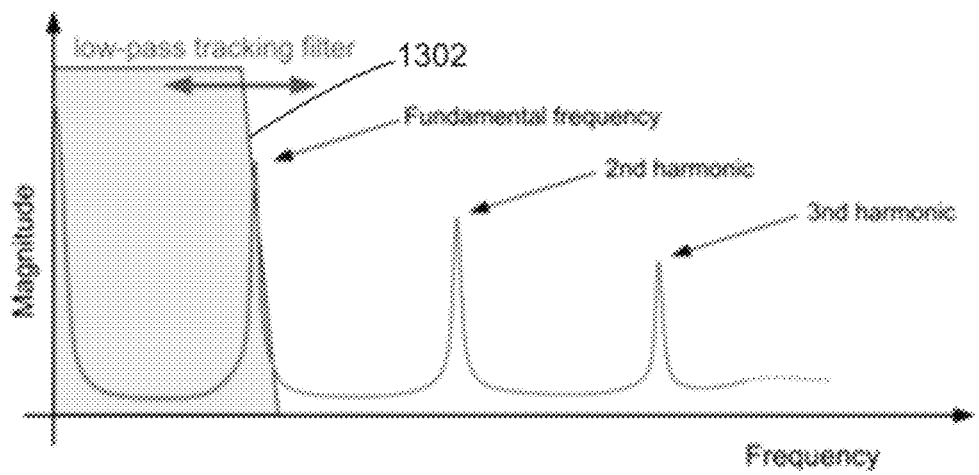
FIG. 13 provides an example illustration of a tuned bandwidth of a low-pass filter according to certain aspects of the present invention.

FIG. 13 provides an example illustration of a tuned bandwidth 1302 of the low-pass filters 1222 and 1242 according to certain aspects of the present invention. In FIG. 13, the tuned bandwidth 1302 of the low-pass filters 1222 and 1242 is illustrated as being adjustable. As described above, the bandwidth 1302 of the low-pass filters 1222 and 1242 is adjusted based on the control signal 1239 generated by the PID controller 1238.

Returning to FIG. 12, the tracking filter 1220 also includes first and second energy detectors 1226 and 1246 that detect the mean energy of the output signals from the in-phase and quadrature tunable low-pass filters 1222 and 1242, respectively. In one embodiment, the energy detectors 1226 and 1246 may generate RMS mean energy output signals for each of the output signals from the in-phase and quadrature tunable low-pass filters 1222 and 1242. The mean energies output from the first and second energy detectors 1226 and 1246 are summed by a summer 1232. Collectively, the mean energies detected and output by the energy detectors 1226 and 1246 (as summed by the summer 1232) comprise a first mean energy output. The tracking filter 1220 further includes in-phase and quadrature energy detectors 1224 and 1244 and summer 1228 that sums the outputs of the in-phase and quadrature energy detectors 1224 and 1244. The output of the summer 1228 comprises a second mean energy output. To provide an input signal to the PID controller 1238 representative of the relative energy of the fundamental frequency of the reflected microwave blade-passing signal in relation to the energy of the down-converted signal, the first mean energy output is inverted by inverter 1234 and summed with the second mean energy output by the summer 1236. As such, the output of the summer 1236 is representative of the difference between the first and second mean energy outputs. In turn, the "difference" output of the summer 1236, which is representative of the relative energy of the fundamental frequency of the reflected microwave blade-passing signal in relation to the energy of the down-converted signal, is provided to the PID controller 1238.

Figure 14:
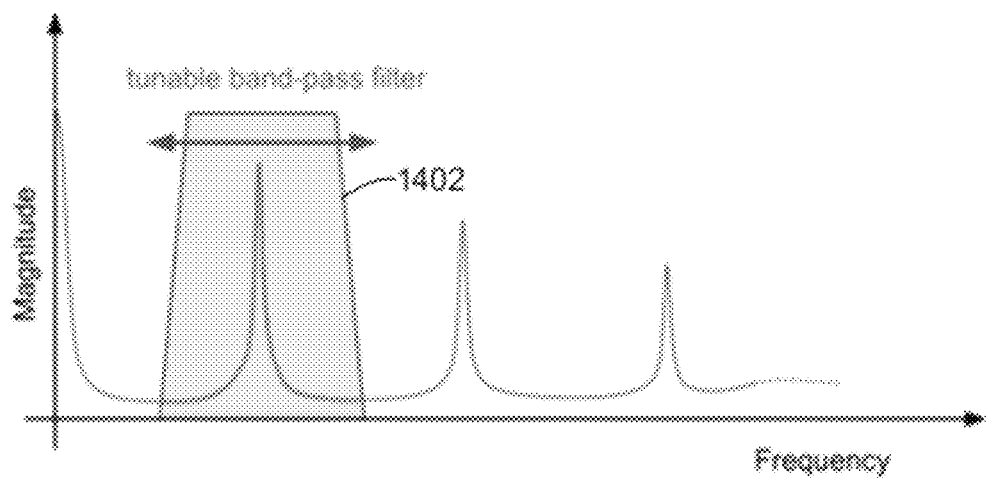
FIG. 14 provides an example illustration of a tuned bandwidth of a band-pass filter according to certain aspects of the present invention.

Based on the control signal 1239 generated by the PID controller 1238, the pass band of tunable band-pass filters 1216 and 1217 of the digital pulse generators 1215a and 1215b are also tuned. As compared to the tunable low-pass filters 1222 and 1242, the tunable band-pass filters 1216 and 1217 comprise second tunable filters. It is noted that a primary function of the tracking filter 1220 is to generate the control signal 1239 as an input to tune the bandwidth of the pass band of the tunable band-pass filters 1216 and 1217, so that pulses may be accurately generated by the zero crossing detectors 1218 and 1219. FIG. 14 provides an example illustration of a tuned bandwidth 1402 of the band-pass filters 1216 and 1217. In FIG. 14, the tuned bandwidth 1402 of the band-pass filters 1216 and 1217 is illustrated as being adjustable. As described above, the bandwidth 1402 of the band-pass filters 1216 and 1217 is adjusted based on the control signal 1239 generated by the PID controller 1238.

Referring back to FIG. 12, the zero crossing detector 1218 detects zero-crossings of the signal output by the tunable band-pass filter 1216 and generates an in-phase pulse train signal $P_I$ based on the zero-crossings. Similarly, the zero crossing detector 1219 detects zero-crossings of the signal output by the tunable band-pass filter 1217 and generates an quadrature pulse train signal $P_Q$ based on the zero-crossings. The in-phase and quadrature pulse train signals $P_I$ and $P_Q$ are provided as inputs to the I/Q selector 1260, which operates in a manner similar to the I/Q selector 850, and provides a pulse train output signal $P_{out}$ representative of the speed of the bladed rotor 130.

Again, the output pulse train signal $P_{out}$ may be provided to the engine controller of an aircraft, so that the engine controller has feedback regarding the speed of the rotor 130. The embodiment of the MPM illustrated in FIG. 12 seeks to provide a pulse train output signal representative of the speed of the bladed rotor 130 as does the embodiment of the MPM illustrated in FIG. 8.

It is again noted that, in alternative embodiments, proximity sensors other than microwave probes may be used. If a proximity sensor other than a microwave probe is used, in certain embodiments, a reflected signal received by the proximity sensor may be down-converted without using separate in-phase and quadrature channels. In this case, the configuration of FIG. 12 may be modified to rely on only one of the in-phase and quadrature sections. In other words, without separate in-phase and quadrature down-converted channels, the configuration of FIG. 12 may be modified for only a single channel similar to either one of the in-phase or quadrature sections.

Before turning to the process flow diagrams of FIGS. 15-18, it is noted that the present invention may be practiced using an alternative order of the steps illustrated in FIGS. 15-18. That is, the process flows illustrated in FIGS. 15-18 are provided as examples only, and the present invention may be practiced using process flows that differ from those illustrated. Additionally, it is noted that not all steps are required in every embodiment. In other words, one or more of the steps may be omitted or replaced, without departing from the spirit and scope of the invention. In alternative embodiments, steps may be performed in different orders, in parallel with one another, or omitted entirely, and/or certain additional steps may be performed without departing from the scope and spirit of the invention.

Figure 15:
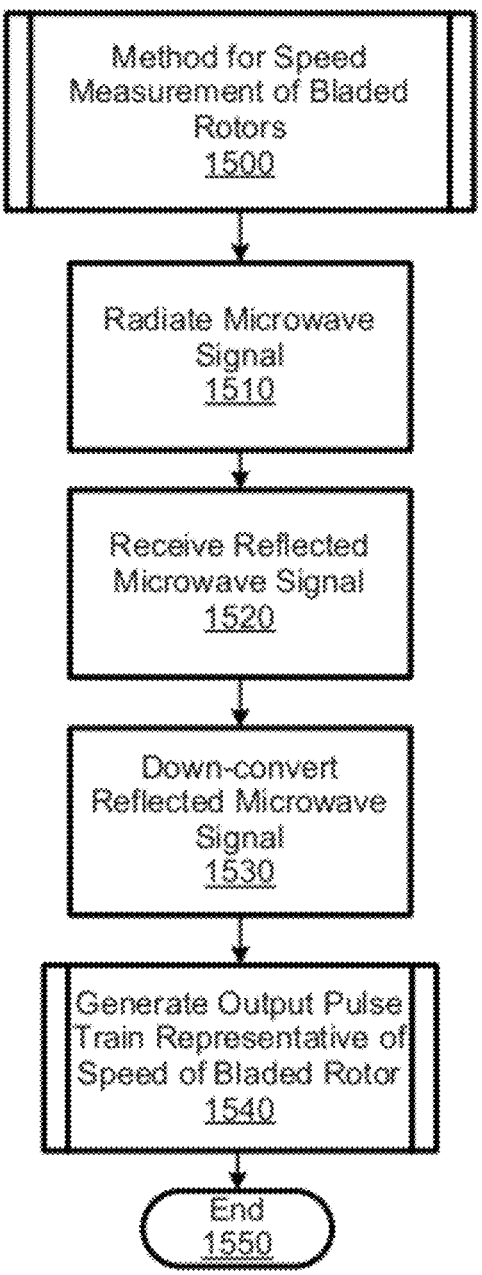
FIG. 15 illustrates an example embodiment of a method for speed measurement of bladed rotors.

With reference to FIG. 15, a method 1500 for speed measurement of bladed rotors is described. The method 1500 is described below in connection with the speed measurement system illustrated in FIGS. 1 and 4, but may be practiced with other systems and embodiments described herein. At step 1510, the electronics unit 110 radiates a microwave signal toward the bladed rotor 130 and, at step 1520, the electronics unit 110 receives reflected microwave signals from the bladed rotor 130. At step 1530, the RFM 420 of the electronics unit 110 down-converts the reflected microwave signal to a down-converted signal. At step 1550, the MPM 410 of the electronics unit 110 generates an output pulse train signal representative of a speed of the bladed rotor 130 based on the down-converted signal.

Figure 16:
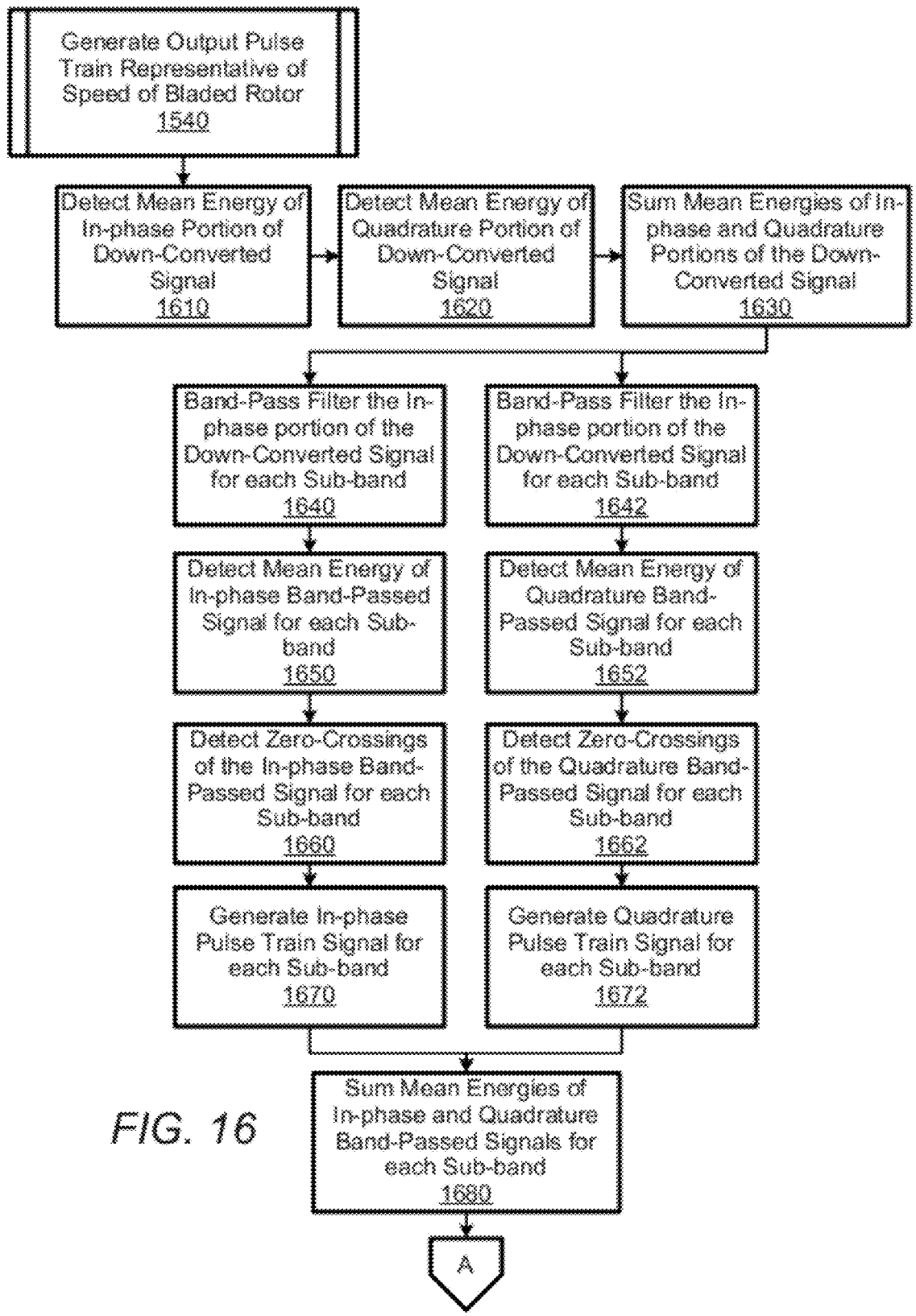
FIG. 16 illustrates an example embodiment of a method for generating an output pulse train representative of a speed of a bladed rotor.

Turning to FIG. 16, one embodiment of the generation of an output pulse train signal at step 1540 is described in further detail. The process of the generation of the output pulse train signal illustrated in FIG. 16 is described in connection with the system elements illustrated in FIG. 8, but may be practiced with other equivalent elements as understood by one having skill in the art. At step 1610, the in-phase energy detector 822 detects a mean energy of an in-phase portion of the down-converted signal and, at step 1620, the quadrature energy detector 824 detects a mean energy of a quadrature portion of the down-converted signal. Proceeding to step 1630, the summer 826 sums the mean energy of the in-phase portion of the down-converted signal and the mean energy of the quadrature portion of the down-converted signal as a total mean energy of the down-converted signal. Further, for each of a plurality of sub-bands of the down-converted signal, the bank of sub-band filters 810 band-pass filters the in-phase portion of the down-converted signal to provide an in-phase band-passed signal at step 1640, detects a mean energy of the in-phase band-passed signal at step 1650, detects zero-crossings of the in-phase band-passed signal at step 1660, and generates an in-phase pulse train signal based on the zero-crossings of the in-phase band-passed signal at step 1670. Similarly, for each of a plurality of sub-bands of the down-converted signal, the bank of sub-band filters 811 band-pass filters the quadrature portion of the down-converted signal to provide a quadrature band-passed signal at step 1642, detects a mean energy of the quadrature band-passed signal at step 1652, detects zero-crossings of the quadrature band-passed signal at step 1662, and generates a quadrature pulse train signal based on the zero-crossings of the quadrature band-passed signal at step 1672.

Figure 17:
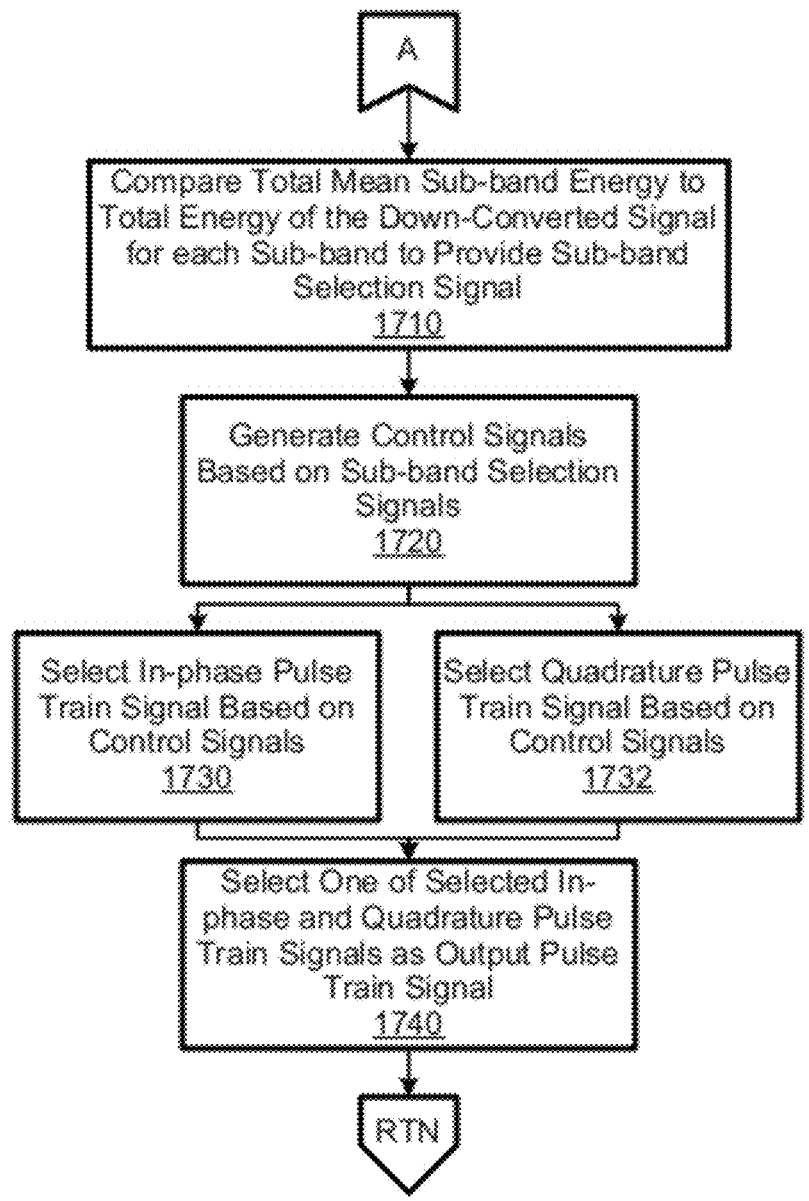
FIG. 17 further illustrates the example embodiment of a method for generating an output pulse train representative of a speed of a bladed rotor.

At step 1680, for each of the plurality of sub-bands of the down-converted signal, the bank of sub-band energy detectors 830 sums the mean energies of the in-phase and quadrature band-passed signals as a total mean sub-band energy. After step 1680, the process proceeds to step 1710, as illustrated in FIG. 17, where, for each of the plurality of sub-bands of the down-converted signal, the bank of sub-band energy detectors 830 compares the total mean sub-band energy to the total mean energy of the down-converted signal to provide a sub-band selection signal. At step 1720, the selection logic 844 generates control signals based on the sub-band selection signals and, at step 1720, the in-phase sub-band selector 842 selects an in-phase pulse train signal among the in-phase pulse train signals of the plurality of sub-bands for output as a selected in-phase pulse train signal based on the control signals. Similarly, at step 1730, the quadrature sub-band selector 846 selects a quadrature pulse train signal among the quadrature pulse train signals of the plurality of sub-bands for output as a selected quadrature pulse train signal based on the control signals. Proceeding to step 1740, the I/Q output selector generates the output pulse train signal by selecting one of the selected in-phase pulse train signal and the selected quadrature pulse train signal as the output pulse train signal representative of the speed of the bladed rotor.

Figure 18:
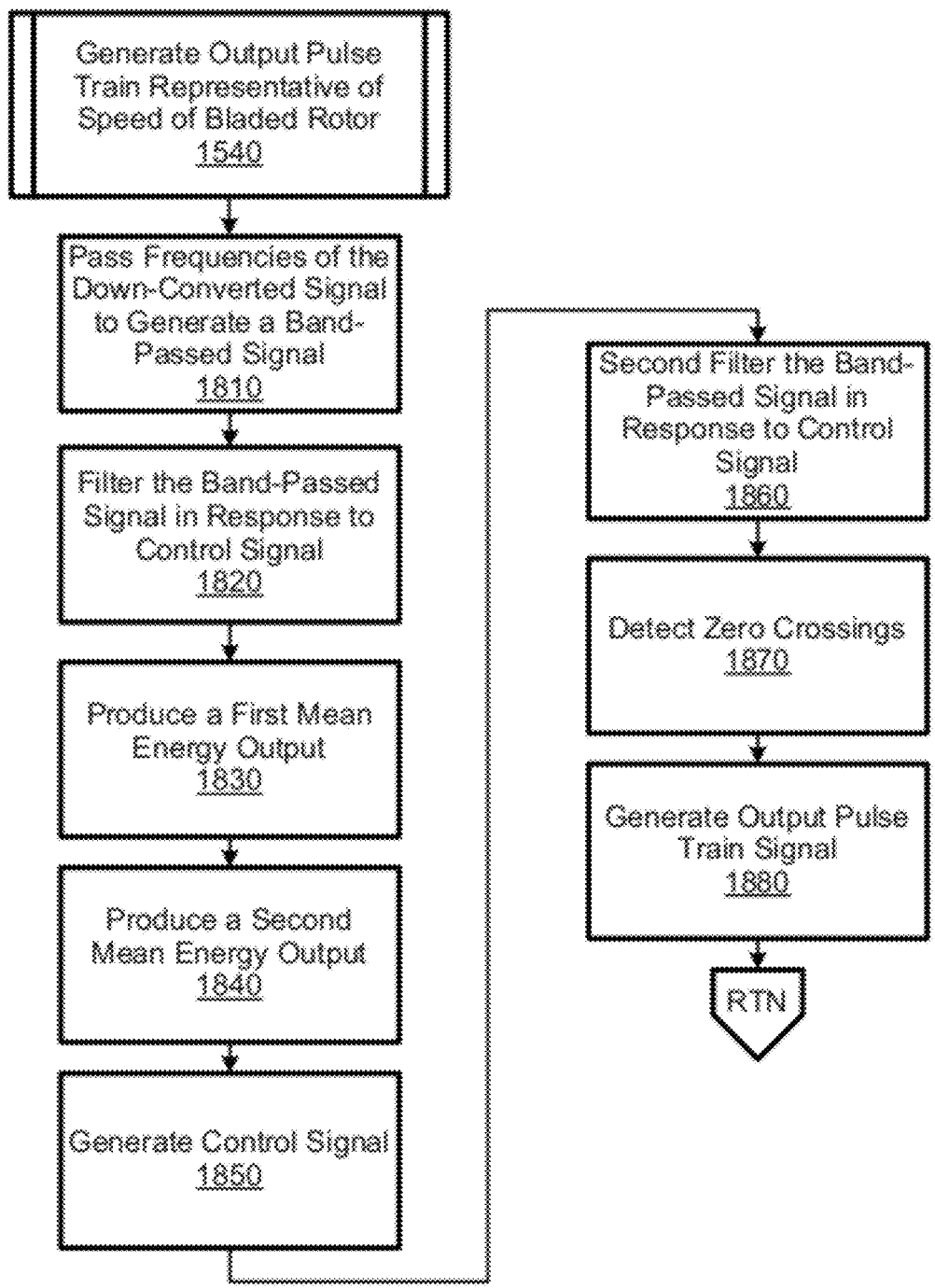
FIG. 18 illustrates another embodiment of a method for generating an output pulse train representative of a speed of a bladed rotor.

Turning to FIG. 18, another embodiment of the generation of an output pulse train signal at step 1540 is described in further detail. The process of the generation of the output pulse train signal illustrated in FIG. 18 is described in connection with the system elements illustrated in FIG. 12, but may be practiced with other equivalent elements as understood by one having skill in the art. At step 1810 the band-pass filter 1210 passes frequencies of the down-converted signal corresponding to a fundamental frequency of the down-converted signal and rejects other frequencies to generate a band-passed signal. At step 1820, the tunable low-pass filters 1222 and 1242 filter the band-passed signal in response to a control signal to provide a filtered output. Proceeding to step 1830, the energy detectors 1226 and 1246 produce a first mean energy output based on the filtered output of the tunable low-pass filters 1222 and 1242. Further, at step 1840, the energy detectors 1224 and 1244 produce a second mean energy based on the band-passed signal.

Proceeding to step 1850, the PID controller 1238 generates the control signal based on a difference between the first and second mean energy outputs. Based on the control signal, the tunable band-pass filters 1216 and 1217 second filter the band-passed signal in response to the control signal to provide a second filtered output at step 1860. Using the second filtered output, the zero crossing detectors 1218 and 1219 detect zero-crossings of the second filtered output at step 1870. Based on the detected zero-crossings, the I/Q selector 1260 generates the output pulse train signal based on the zero-crossings at step 1880.

Although embodiments of the present invention have been described herein in detail, the descriptions are by way of example. The features of the invention described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

The invention claimed is:

1. An apparatus for measuring an angular speed of a bladed rotor, comprising:
    a microwave sensor configured to radiate a continuous-wave microwave signal toward the bladed rotor and receive a reflected microwave signal from the bladed rotor;
    a radio frequency module that generates the continuous-wave microwave signal radiated by the microwave sensor and down-converts the reflected microwave signal into a down-converted signal; and
    a main processing module configured to generate an output pulse train signal representative of the angular speed of the bladed rotor based on one of an in-phase portion or a quadrature portion of the down-converted signal.

2. The apparatus of claim 1, wherein the main processing module comprises a bank of sub-band filters, a signal energy detector, a bank of sub-band energy detectors, a sub-band selector, and an in-phase/quadrature output selector.

3. The apparatus of claim 2, wherein the signal energy detector comprises an in-phase energy detector that detects a mean energy of the in-phase portion of the down-converted signal, a quadrature energy detector that detects a mean energy of the quadrature portion of the down-converted signal, and a summer that sums the mean energy of the in-phase portion of the down-converted signal and the mean energy of the quadrature portion of the down-converted signal as a total mean energy of the down-converted signal.

4. The apparatus of claim 3, wherein
the bank of sub-band filters comprises a plurality of sub-band filter pairs,
each sub-band filter pair comprises an in-phase sub-band filter and a quadrature sub-band filter,
each in-phase sub-band filter comprises a band-pass filter that provides an in-phase band-passed signal based on the in-phase portion of the down converted signal, a mean energy detector that detects a mean energy of the in-phase band-passed signal, and a zero-crossing detector that detects zero-crossings of the in-phase band-passed signal and generates an in-phase pulse train signal based on the zero-crossings of the in-phase band-passed signal, and
each quadrature sub-band filter comprises a band-pass filter that provides a quadrature band-passed signal based on the quadrature portion of the down converted signal, a mean energy detector that detects a mean energy of the quadrature band-passed signal, and a zero-crossing detector that detects zero-crossings of the quadrature band-passed signal and generates a quadrature pulse train signal based on the zero-crossings of the quadrature band-passed signal.

5. The apparatus of claim 4, wherein
the bank of sub-band energy detectors comprises a plurality of sub-band energy detectors, and
each sub-band energy detector comprises another summer that sums the mean energy of the in-phase band-passed signal and the mean energy of the quadrature band-passed signal from a respective in-phase and quadrature sub-band filter pair as a total mean sub-band energy, and a comparator that compares the total mean sub-band energy to the total mean energy of the down-converted signal and provides a sub-band selection signal.

6. The apparatus of claim 5, wherein
the sub-band selector comprises selection logic, an in-phase sub-band selector, and a quadrature sub-band selector,
the selection logic generates control signals for the in-phase sub-band selector and the quadrature sub-band selector based on the sub-band selection signals from the sub-band energy detectors,
the in-phase sub-band selector selects an in-phase pulse train signal among the in-phase pulse train signals generated from the in-phase sub-band filters for output as a selected in-phase pulse train signal based on the control signals, and
the quadrature-phase sub-band selector selects a quadrature pulse train signal among the quadrature pulse train signals generated from the quadrature sub-band filters for output as a selected quadrature pulse train signal based on the control signals.

7. The apparatus of claim 6, wherein the in-phase/quadrature output selector outputs one of the selected in-phase pulse train signal and the selected quadrature pulse train signal as the output pulse train signal representative of the speed of the bladed rotor.

8. The apparatus of claim 6, wherein
the in-phase/quadrature output selector is configured to
select one of the selected in-phase pulse train signal and the selected quadrature pulse train signal for output as the output pulse train signal representative of the speed of the bladed rotor, and
maintain the selection of the one of the pulse train signals for output until a predetermined number of falling or rising edges occurs on another one of the pulse train signals while no falling or rising edges occur on the selected one of the pulse train signals.

9. A method for measuring an angular speed of a bladed rotor, comprising:
radiating a continuous-wave microwave signal toward the bladed rotor;
receiving a reflected microwave signal from the bladed rotor;
down-converting the reflected microwave signal into a down-converted signal; and
generating an output pulse train signal representative of the angular speed of the bladed rotor based on one of an in-phase portion or a quadrature portion of the down-converted signal.

10. The method of claim 9, wherein generating the output pulse train signal further comprises
detecting a mean energy of the in-phase portion of the down-converted signal and a mean energy of the quadrature portion of the down-converted signal;
summing the mean energy of the in-phase portion of the down-converted signal and the mean energy of the quadrature portion of the down-converted signal as a total mean energy of the down-converted signal.

11. The method of claim 10, wherein generating the output pulse train signal further comprises, for each of a plurality of sub-bands of the down-converted signal,
band-pass filtering the in-phase portion of the down-converted signal to provide an in-phase band-passed signal;
detecting a mean energy of the in-phase band-passed signal;
detecting zero-crossings of the in-phase band-passed signal;
generating an in-phase pulse train signal based on the zero-crossings of the in-phase band-passed signal;
band-pass filtering the quadrature portion of the down-converted signal to provide a quadrature band-passed signal;
detecting a mean energy of the quadrature band-passed signal;
detecting zero-crossings of the quadrature band-passed signal; and
generating a quadrature pulse train signal based on the zero-crossings of the quadrature band-passed signal.

12. The method of claim 11, wherein generating the output pulse train signal further comprises, for each of the plurality of sub-bands of the down-converted signal,
summing the mean energies of the in-phase and quadrature band-passed signals as a total mean sub-band energy; and
comparing the total mean sub-band energy to the total mean energy of the down-converted signal to provide a sub-band selection signal.

13. The method of claim 12, wherein generating the output pulse train signal further comprises
generating control signals based on the sub-band selection signals;

selecting an in-phase pulse train signal among the in-phase pulse train signals of the plurality of sub-bands for output as a selected in-phase pulse train signal based on the control signals; and selecting a quadrature pulse train signal among the quadrature pulse train signals of the plurality of sub-bands for output as a selected quadrature pulse train signal based on the control signals.

14. The method of claim 13, wherein generating the output pulse train signal further comprises selecting one of the selected in-phase pulse train signal and the selected quadrature pulse train signal as the output pulse train signal representative of the speed of the bladed rotor.

15. An apparatus for measuring an angular speed of a bladed rotor, comprising:
a microwave sensor configured to radiate a continuous-wave microwave signal toward the bladed rotor and receives a reflected microwave signal from the bladed rotor;
a radio frequency module that generates the continuous-wave microwave signal radiated by the microwave sensor and down-converts the reflected microwave signal into a down-converted signal; and
a main processing module comprising a band-pass filter, a tracking filter, a digital pulse generator, and an in-phase/quadrature output selector, the main processing module being configured to generate an output pulse train signal representative of the angular speed of the bladed rotor based on the down-converted signal.

16. The apparatus of claim 15, wherein
the band-pass filter passes frequencies of the down-converted signal corresponding to a fundamental frequency of the down-converted signal and rejects other frequencies to generate a band-passed signal.

17. The apparatus of claim 16, wherein the tracking filter further comprises
a tunable low-pass filter and mean energy detector that low-pass filters the band-passed signal based on a control signal and generates a first mean energy output based on an output of the low-pass filter,
a second mean energy detector that determines a second mean energy output based on the band-passed signal, and
a controller that generates the control signal based on a difference between the first and second mean energy outputs.

18. The apparatus of claim 17, wherein the digital pulse generator comprises a second tunable filter that filters the band-passed signal based on the control signal, and a pulse generator that detects zero-crossings of the signal output by the second tunable filter and generates a pulse train signal based on the zero-crossings.

19. The apparatus of claim 17, wherein
the digital pulse generator comprises in-phase and quadrature pulse generators,
the in-phase pulse generator further comprises an in-phase tunable filter that filters an in-phase portion of the band-passed signal based on the control signal, and
the quadrature pulse generator further comprises a quadrature tunable filter that filters a quadrature portion of the band-passed signal based on the control signal.

20. The apparatus of claim 19, wherein
the in-phase pulse generator further comprises an in-phase pulse generator that detects zero-crossings of the signal output by the in-phase tunable filter and generates an in-phase pulse train signal based on the in-phase zero-crossings, and the quadrature pulse generator further comprises a quadrature pulse generator that detects zero-crossings of the signal output by the quadrature tunable filter and generates a quadrature pulse train signal based on the quadrature zero-crossings.

21. The apparatus of claim 20, wherein the in-phase/quadrature output selector outputs one of the in-phase pulse train signal and the quadrature pulse train signal as the output pulse train signal representative of the speed of the bladed rotor.

22. The apparatus of claim 20, wherein
the in-phase/quadrature output selector is configured to
select one of the selected in-phase pulse train signal and the selected quadrature pulse train signal for output as the output pulse train signal representative of the speed of the bladed rotor, and
maintain the selection of the one of the pulse train signals for output until a predetermined number of falling or rising edges occurs on another one of the pulse train signals while no falling or rising edges occur on the selected one of the pulse train signals.

23. A method for measuring an angular speed of a bladed rotor, comprising:
radiating a microwave signal toward the bladed rotor;
receiving a reflected microwave signal from the bladed rotor;
down-converting the reflected microwave signal into a down-converted signal; and
generating an output pulse train signal representative of the angular speed of the bladed rotor based on one of an in-phase portion or a quadrature portion of the down-converted signal,
wherein generating the output pulse train signal further comprises:
passing frequencies of the down-converted signal corresponding to a fundamental frequency of the down-converted signal and rejecting other frequencies to generate a band-passed signal; and
filtering the band-passed signal in response to a control signal to provide a filtered output.

24. The method of claim 23, further comprising
producing a first mean energy output based on the filtered output; and
producing a second mean energy based on the band-passed signal.

25. The method of claim 24, further comprising
generating the control signal based on a difference between the first and second mean energy outputs.

26. The method of claim 25, further comprising
second filtering the band-passed signal in response to the control signal to provide a second filtered output.

27. The method of claim 26, further comprising
detecting zero-crossings of the second filtered output; and
generating the output pulse train signal based on the zero-crossings.

28. An apparatus for measuring a speed of a bladed rotor, comprising:
a sensor that radiates a continuous-wave signal toward the bladed rotor and receives a reflected signal from the bladed rotor;
a radio frequency module that generates the continuous-wave signal radiated by the sensor and down-converts the reflected signal into a down-converted signal; and
a main processing module configured to generate an output pulse train signal representative of a speed of the bladed rotor based on one of an in-phase portion or a quadrature portion of the down-converted signal.

29. The apparatus of claim 28, wherein
the main processing module comprises a bank of sub-band filters, a signal energy detector, a bank of sub-band energy detectors, and a sub-band selector, and
the signal energy detector detects a mean energy of the down-converted signal.

30. The apparatus of claim 29, wherein
the bank of sub-band filters comprises a plurality of sub-band filters, and
each sub-band filter comprises a band-pass filter that provides a band-passed signal based on the down converted signal, a mean energy detector that detects a mean energy of the band-passed signal, and a zero-crossing detector that detects zero-crossings of the band-passed signal and generates a pulse train signal based on the zero-crossings of the band-passed signal.

31. The apparatus of claim 30, wherein
the bank of sub-band energy detectors comprises a plurality of sub-band energy detectors, and
each sub-band energy detector comprises a comparator that compares the mean energy of a respective one of the band-passed signals to the mean energy of the down-converted signal and provides a sub-band selection signal.

32. The apparatus of claim 31, wherein
the sub-band selector comprises selection logic and a sub-band selector,
the selection logic generates control signals for the sub-band selector based on the sub-band selection signals from the sub-band energy detectors, and
the sub-band selector selects a pulse train signal among the pulse train signals generated from the sub-band filters for output as the output pulse train signal based on the control signals.

33. An apparatus for measuring a speed of a bladed rotor, comprising:
a sensor that radiates a continuous-wave signal toward the bladed rotor and receives a reflected signal from the bladed rotor;
a radio frequency module that generates the continuous-wave signal radiated by the sensor and down-converts the reflected signal into a down-converted signal; and
a main processing module comprising a band-pass filter, a tracking filter, and a digital pulse generator, the main processing module being configured to generate an output pulse train signal representative of a speed of the bladed rotor based on the down-converted signal.

34. The apparatus of claim 33, wherein
the band-pass filter passes frequencies of the down-converted signal corresponding to a fundamental frequency of the down-converted signal and rejects other frequencies to generate a band-passed signal.

35. The apparatus of claim 33, wherein the tracking filter further comprises
a tunable low-pass filter and mean energy detector that low-pass filters the band-passed signal based on a control signal and generates a first mean energy output based on an output of the low-pass filter,
a second mean energy detector that determines a second mean energy output based on the band-passed signal, and
a controller that generates the control signal based on a difference between the first and second mean energy outputs.

36. The apparatus of claim 35, wherein the digital pulse generator comprises a second tunable filter that filters the band-passed signal based on the control signal, and a pulse generator that detects zero-crossings of the signal output by the second tunable filter and generates the output pulse train signal based on the zero-crossings.

\* \* \* \* \*